(12) United States Patent
Hesselink et al.

(10) Patent No.: US 6,414,763 B1
(45) Date of Patent: Jul. 2, 2002

(54) DIGITAL HOLOGRAPHIC CAMERA SYSTEM AND METHOD HAVING REMOVABLE MEDIA

(75) Inventors: Lambertus Hesselink, Atherton; Matthew C. Bashaw, San Jose, both of CA (US)

(73) Assignee: Siros Technology, Inc., San Jose, CA (US)

( * ) Notice: Subject to any disclaimer, the term of this patent is extended or adjusted under 35 U.S.C. 154(b) by 0 days.

(21) Appl. No.: 09/612,339

(22) Filed: Jul. 6, 2000

Related U.S. Application Data

(63) Continuation of application No. 09/143,125, filed on Aug. 28, 1998, now abandoned.

(51) Int. Cl.[7] .......................... G02B 5/32; G03H 1/26; G03H 1/04; G11C 13/04; G06K 9/76
(52) U.S. Cl. ..................... 359/21; 359/22; 359/35; 359/15; 365/125; 382/210; 348/232
(58) Field of Search ................. 359/3, 10, 11, 359/12, 22, 21, 35, 15; 382/210, 211; 348/232; 365/125

(56) References Cited

U.S. PATENT DOCUMENTS

| | | | |
|---|---|---|---|
| 4,024,513 A | 5/1977 | Huignard et al. | 340/173 LT |
| 5,376,965 A | 12/1994 | Nagaski et al. | 348/232 |
| 5,450,218 A | 9/1995 | Heanue et al. | 359/21 |
| 5,515,183 A | 5/1996 | Hashimoto | 359/9 |
| 5,638,193 A | 6/1997 | Trisnadi et al. | 359/11 |
| 5,740,276 A | 4/1998 | Tomko et al. | 382/210 |
| 5,812,288 A | 9/1998 | Curtis et al | 359/21 |
| 5,838,469 A | 11/1998 | Campbell et al. | 359/21 |
| 5,949,559 A | 9/1999 | Kihara et al. | 359/23 |

Primary Examiner—Audrey Chang
(74) Attorney, Agent, or Firm—Sierra Patent Group, Ltd.

(57) ABSTRACT

A digital electronic camera includes a holographic medium, an imaging array disposed at a focal plane for converting optical information to digital information; and an optical system configured to store the digital information onto the holographic medium. An optical system for retrieving images stored in the medium may be provided inside the camera or as a separate appliance.

24 Claims, 23 Drawing Sheets

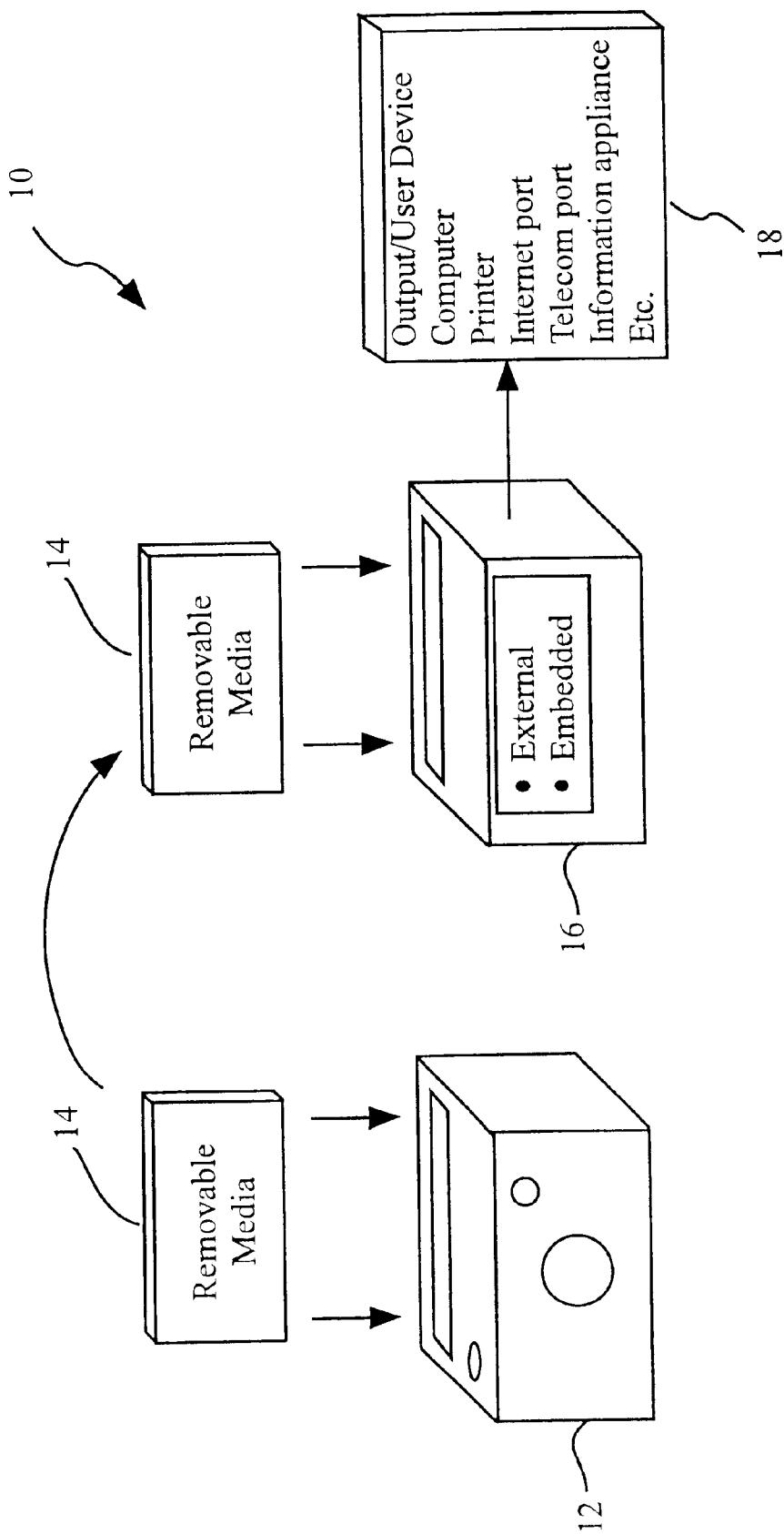

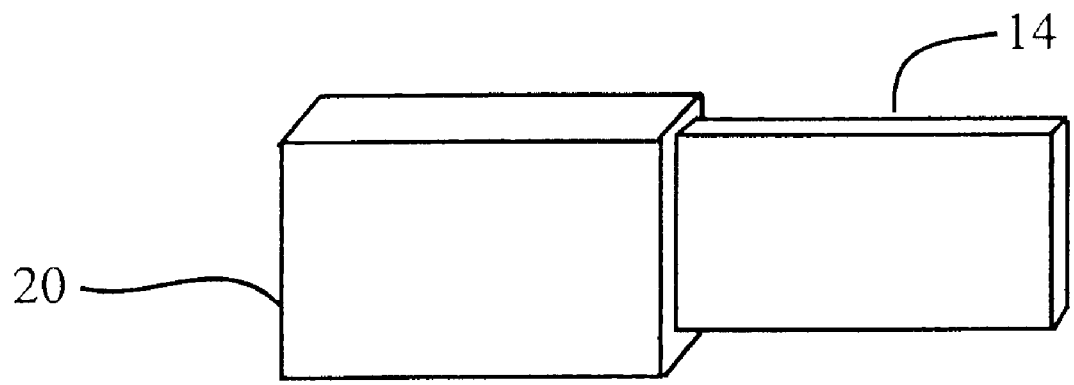
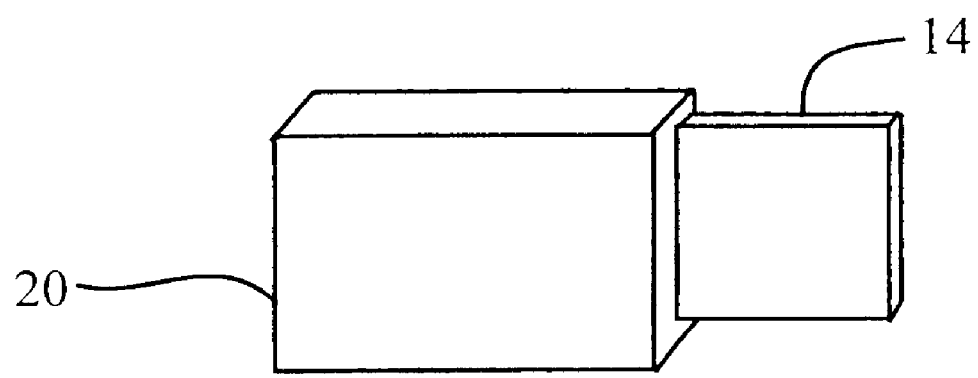
Fig. 2A

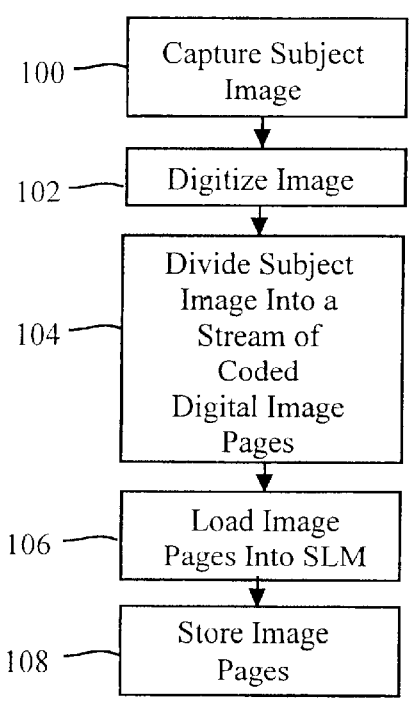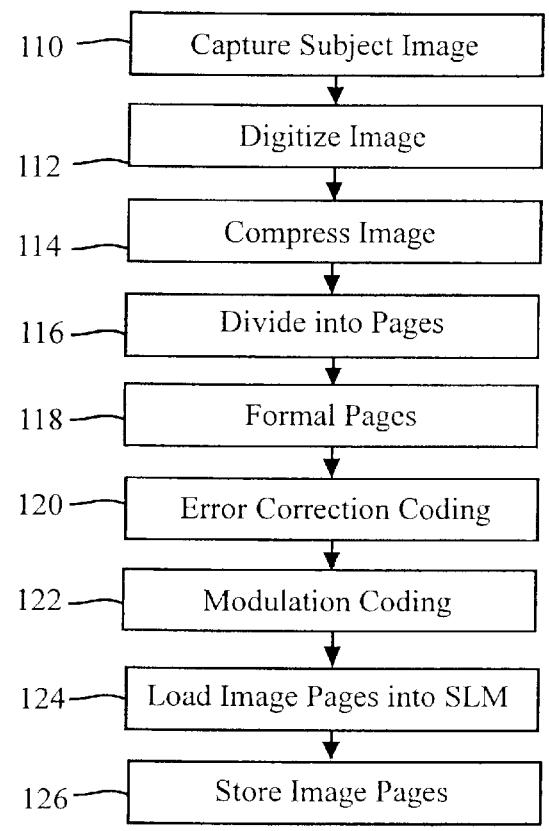
Fig. 7A
Fig. 7B

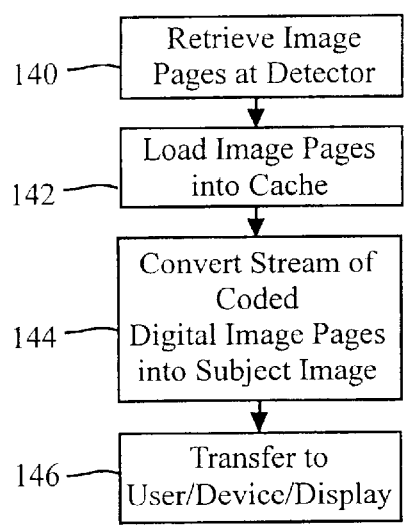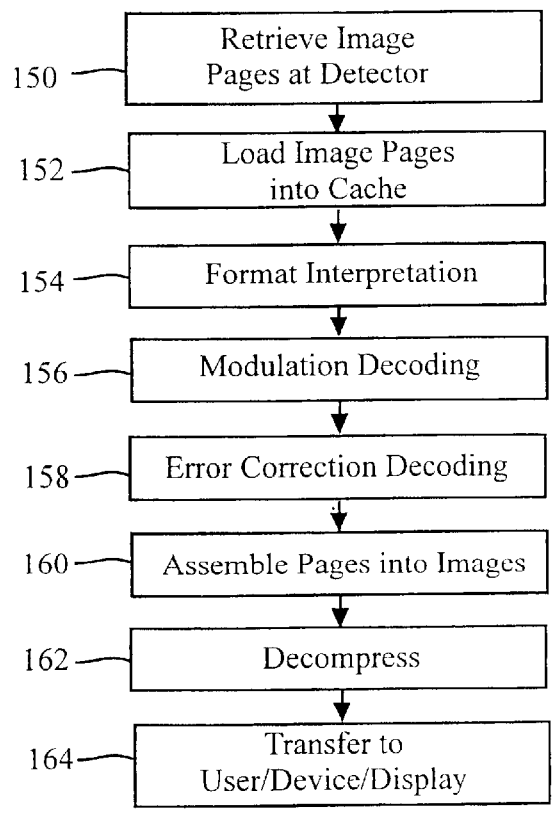
Fig. 10A
Fig. 10B

DIGITAL HOLOGRAPHIC CAMERA SYSTEM AND METHOD HAVING REMOVABLE MEDIA

PRIORITY CLAIMED

This application is a Continuation of U.S. patent application No. 09/143,125, filed Aug. 28, 1998 now abandoned.

BACKGROUND OF THE INVENTION

1. Field of the Invention

The present invention relates to digital cameras. More specifically, the present invention relates to a digital camera system employing digital holographic storage.

2. The Prior Art

Digital cameras are known in the art. Most such cameras employ charge-coupled device (CCD) or complementary metal oxide semiconductor (CMOS) imager arrays for generating image data which are then stored in digital semiconductor memory for later readout and viewing.

Holographic camera systems that use analog image storage are known in the art. U.S. Pat. No. 5,101,397 to Banjo discloses a method for recording signals on and reading signals from film. U.S. Pat. No. 5,144,461 to Horan discloses a portable holographic recording apparatus. U.S. Pat. No. 4,707,053 to Gurevich et al. discloses a recording device. U.S. Pat. No. 5,515,183 to Hashimoto discloses a real-time holography system. U.S. Pat. 4,735,474 to Allon discloses a photograph booth with automatic holographic camera. U.S. Pat. No. 4,376,950 to Brown et al. discloses a three-dimensional television system using holographic techniques.

BRIEF DESCRIPTION OF THE INVENTION

According to a first aspect of the present invention, a digital holographic camera device, medium, reader, and system for recording photographs digitally and transferring the data to a computer or other digital device is disclosed. Preferably, a storage device, which comprises a removable cartridge containing a recording medium, is placed inside a digital holographic camera. Alternatively, a fixed medium may be employed. The medium is situated inside the camera in an appropriate manner so that digital data can be recorded onto it holographically. The medium comprises a photosensitive material capable of digital holographic recording, e.g. a photopolymer or photorefractive crystal. The medium can also comprise other layers, such as a substrate and protective layers.

Generally, picture data are first converted to a bit stream, which is then recorded onto the medium digitally using holographic storage techniques. The data can be buffered in solid-state memory prior to holographic recording. The holographic recording subsystem of the present invention can comprise, for example, a low-power laser and a spatial-light modulator. Multiple holograms can be recorded using techniques that include angular multiplexing, wavelength multiplexing, phase encoded multiplexing, and related multiplexing techniques that allow the storage of multiple holograms at the same spatial location. Additionally, multiple holograms can be recorded at multiple spatial locations. This can be facilitated, e.g., by including a media advance mechanism in the storage device, by designing the cartridge to facilitate media advance by the camera, or by optical beam steering. Linear and rotary advance mechanisms are suitable. The storage device may also take the form of a monolithic card.

The digital holographic camera according to the present invention can be designed for data recording only. The camera can also be designed to have readout capability to output recorded data directly. In the first case, the removable holographic storage device can be transferred to a dedicated reader. The removable holographic storage media cartridge, when used, is designed to transfer from the camera to the reader in a manner that keeps the media intact during the transfer i.e., light tight. The reader can have a media delivery mechanism, a low-power laser, an imaging lens as needed, and a detector array such as a CCD array or a CMOS detector array. Certain output configurations require an output imaging lens, and others do not. The reader can connect to a computer as a peripheral device or may be integrated into a computer. The reader can also be integrated directly into other devices, such as a printer dedicated to printing out photographs, so that the media can be read without the use of a computer.

In addition to photo data, the high capacity afforded by holographic data storage allows a host of other types of data to be stored digitally integrated with the photo data. Examples include voice annotation, date/location/exposure conditions/etc., and other information that describes the circumstances of the photo, as well as other data not necessarily related to the circumstances of the photo, such as music.

The data can be organized using variable formats in which a portion of the storage media records data using low resolution pixels and the rest of the media uses higher resolution pixels. An advantage of this process is that the level of resolution of a large section of the material can be identified by a dedicated low resolution region, so that as higher resolution cameras, media, and readers are introduced, low resolution media are compatible with high resolution media. The system of the present invention can use switch-out program cards to control operation, e.g. annotation, resolution control.

Using one or more flip-mirrors or additional beam splitters, the output light can alternately be directed to a view finder to view the recorded data.

From a user's perspective, the digital holographic camera of the present invention can operate in a manner similar to a conventional film camera. The capacity of each cartridge can be based on current film packaging, which emphasizes film speed and count. For example, cartridges can be differentiated according to resolution in a manner similar to the distinction between high-speed and low-speed film, which generally have lower and higher resolution, respectively. By providing predetermined picture counts, e.g. 24 or 36, required capacity is based on count and resolution. The picture count can potentially be increased beyond levels available for typical film cartridges (e.g. 48, 64) in order to increase the attractiveness of the technology. Capacities on the order of 128 Mbytes would provide a distinct advantage over present capacities of 8–16 Mbytes for current flash memory cameras.

The present invention provides the ability to use low-cost, high-capacity media in a variety of form factor and data formats.

The present invention further provides the ability to incorporate high-capacity annotation, such as voice annotation, in digital form.

Additional advantages of the present invention include use of a digital page-based system in a digital camera; ability to play back data in the camera or separately outside the camera; possibility to reuse some camera components for image acquisition and display for page-based holographic storage.

BRIEF DESCRIPTION OF THE DRAWING FIGURES

FIG. 1 is a block diagram of a digital holographic camera system according to a presently contemplated embodiment of the present invention.

FIGS. 2A ands 2B are diagrams of alternate embodiments of media and media cartridges that may be used with the digital holographic camera system of the present invention.

FIGS. 7A and 7B are flow diagrams illustrating the storage process for digital holographic images according to the present invention.

FIGS. 10A and 10B are flow diagrams illustrating the readout process for digital holographic images according to the present invention.

DETAILED DESCRIPTION OF A PREFERRED EMBODIMENT

Figure 2B:
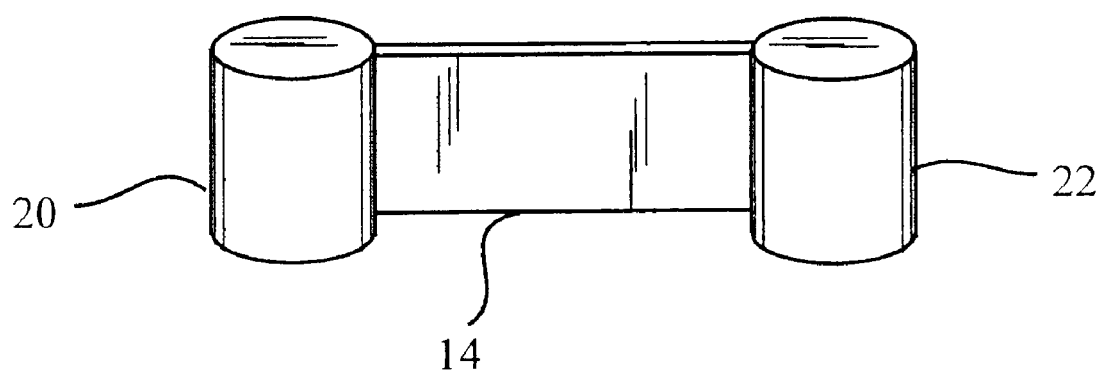

Persons of ordinary skill in the art will realize that the following description of the present invention is illustrative only and not in any way limiting. Other embodiments of the invention will readily suggest themselves to such skilled persons.

Referring first to FIG. 1, a generalized block diagram of the digital holographic camera and reader system 10 of the present invention is illustrated. According to a presently preferred embodiment of the invention, the camera system 10 includes a camera 12 employing a digital holographic storage system as will be further disclosed herein. Camera 12 utilizes a holographic device 14 for recording images.

The medium 14 illustrated in FIG. 1 is a removable medium, although persons of ordinary skill in the art will appreciate that cameras according to the present invention could also employ fixed (non-removable) media.

A reader 16 is also provided and includes a holographic playback system as will be further disclosed herein. The reader is equipped to display images stored in removable media transferred thereto from camera 12 and may also be provided with an output that may be used to transmit image data to an external device 18, such as a computer, printer, internet or telecommunications port, or some other information appliance.

Although a fixed medium can be employed in the camera 12 according to the present invention, particularly if the medium is erasable, it is generally desirable to have removable medium as illustrated in FIG. 1. The removable medium 14 of FIG. 1 (or a fixed medium) can comprise a photopolymer on a substrate or a flexible delivery material. Photosensitive crystals can also be used. The medium may be rigid or flexible and can take on several forms including a roll of photopolymer film, a cube or slab of photopolymer, photorefractive, or other photosensitive material; a card, a small disk, or tape. The overall form factor is flexible. The media may take on a form factor similar to ordinary film and digital storage options. In embodiments where the medium is removable, a holder to receive the medium and maintain it in a mechanically stable state is disposed in the camera at an appropriate position.

As shown in FIGS. 2A and 2B, the holographic storage device can comprise a medium 14 that may be optionally mounted in a cartridge 20. The media cartridge 20, when used, can protect the medium from factors, such as light, in the external environment that can affect it. In FIG. 2A the medium 14 is shown at two different stages of insertion into cartridge 20, which is formed from a suitable material such as a plastic material. As will be appreciated by persons of ordinary skill in the art, the medium 14 can reside in the cartridge when not in use, thus protecting it from environmental factors such as light. The medium can be removed from or can extend from the cartridge during use in the camera. In FIG. 2B, the medium 14 is in the form of a flexible strip and cartridge 20 may comprise a container similar to the convention 35 mm or other form-factor photographic film canister. A take-up device 22 is employed to advance the position of medium 14 for sequential exposures in the manner known for ordinary photographic film. In the camera, the media and take-up mechanism can also be moved in a direction perpendicular to the take-up direction.

According to one aspect of the present invention, the medium 14 can be stored in a light-tight cartridge to insure that it remains intact during storage and during transfer to and from the camera and reader.

According to other aspects of the present invention, the medium 14 can be configured with a portion of the recording area dedicated to media management and content management. This region can be used for purposes such as identification of recording zones, resolution characteristics for backward compatibility, compatible media, material properties for exposure control, selection of media portion, fiducial marks for media alignment in an external reader, and data on recorded zones to allow switching between partially used media.

According to yet other aspects of the present invention, holographic storage devices are configured with fixed image count and a fixed resolution. In order for users to easily identify with the media, this capacity can be defined in a manner similar to that used with current ordinary photographic film packages. For example, ordinary film speeds of ASA 50–100 and below correspond to bright light, high-resolution pixel definition, and therefore higher capacity per image. Ordinary film speeds of ASA 400–800 and above correspond to high speed, low light, low-resolution pixel definition. Similar designations can be applied to packaged holographic media. Media capacity can be based on resolution, e.g., a media cartridge may offer either 24 or 36 exposures at one of two certain predetermined resolutions. Exposure count can also be pushed to 48 or 64 or higher to emphasize the capacity advantages of digital holographic cameras. Storage devices can be configured for variable image resolution so that low-resolution and high-resolution images can reside on the same medium.

Once the medium 14 is loaded, the camera 12 may be used to capture multiple digital photographic images. The photographic images can all be produced in the same format or they can be of different formats.

Once a desired number of digital photographic images have been recorded, the medium 14 may be unloaded from the camera and loaded into the reader 16. The reader 16 can be an external device, and can be connected, for example, to an output device 18 such as a computer as indicated in FIG. 1. The reader 16 can also connect directly to other devices. Alternatively, the reader 16 can be embedded into a device that serves a specific function. Non-exhaustive examples of suitable devices that could incorporate an embedded reader include computers, printers, a storage device with an Internet port or a telecommunications port, an information appliance, etc. Thus, an advantageous feature of the system 10 of the present invention is the possibility of utilizing a subsystem comprising a holographic reader and a device that performs a specific function using data retrieved by the reader.

Figure 3:
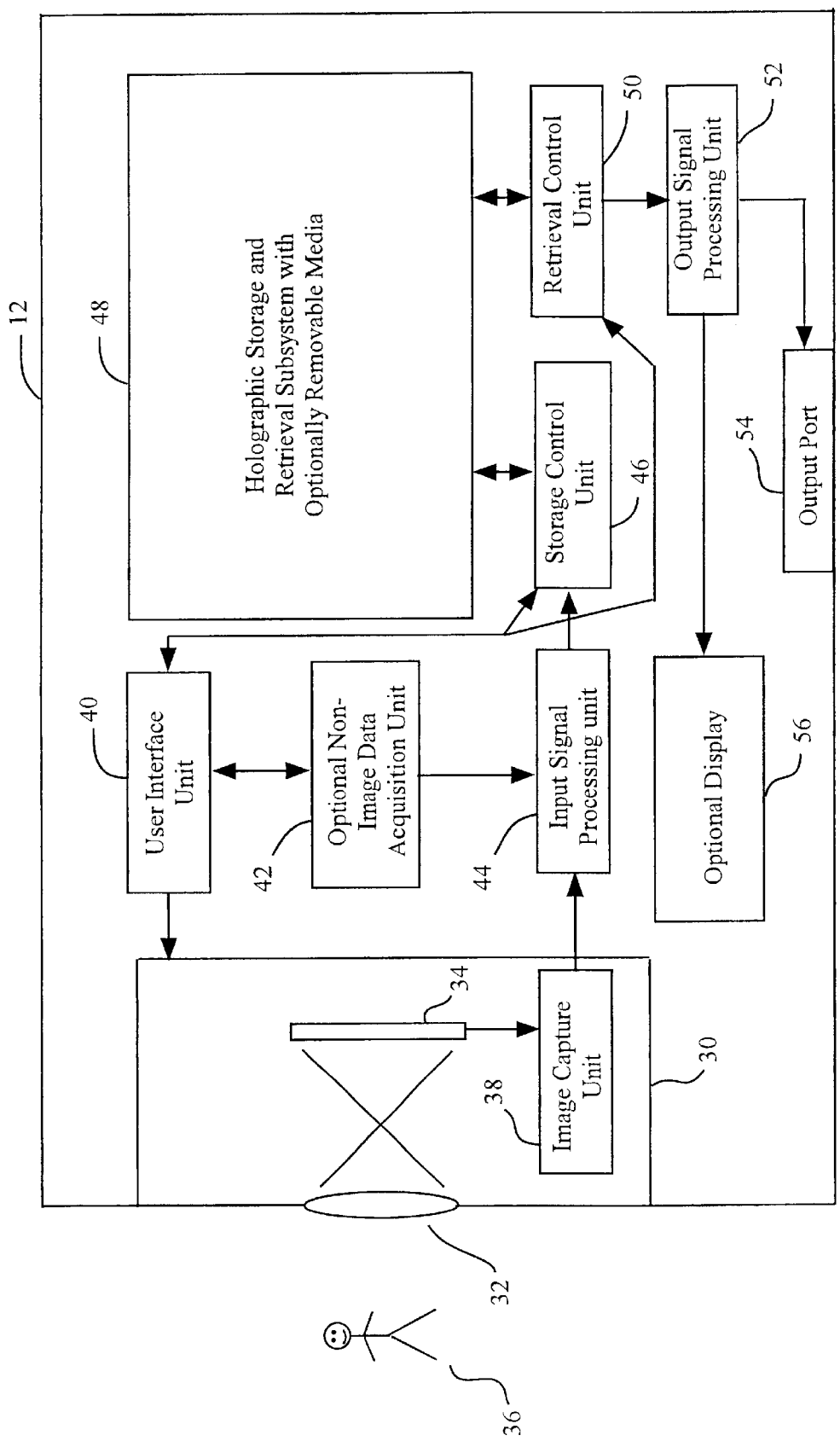
FIG. 3 is a block diagram of an example of a digital holographic camera including holographic storage and retrieval according to the present invention.

Referring now to FIG. 3, a block diagram of an illustrative embodiment of a digital holographic camera 12 of FIG. 1 is presented. The camera 12 of FIG. 3 may be used for both recording and readout of digital holographic data and will generally require more components and incur greater cost than a system that provides only recording capability. In this and subsequent block diagrams, arrows indicate the general flow of information. A person skilled in the information systems control art will understand that some information signal flow will be bi-directional.

As may be seen from FIG. 3, camera 12 includes an image-capture subsection 30, comprising lens 32 and image detector 34. Although only one image detector 34 is depicted in FIG. 3, persons of ordinary skill in the art will appreciate that one or more CCD or CMOS image detectors may be employed in the digital holographic camera of the present invention in conjunction with a prism to divide the image into red, green, and blue components for the individual detectors as is known in the art. Other color separation techniques, such as providing a single image detector with color filtered pixels, can also be employed with the present invention.

Lens 32 focuses an image of a subject 36 on imaging array 34 located at the focal plane of the lens. The image capture subsystem is representative of a variety of subsystems available in digital image cameras; the image capture unit captures the subject image and digitizes the image.

The image capture unit 38 comprises circuitry used in conjunction with the image detector 34 to read pixel data captured by the detector 34 and output the data in three-color grey-scale format. Such circuitry is well known in the art and may be provided by the vendor along with the image detector 34.

The user interface unit 40 functions to determine if there is space left to record data, to capture an image and to add non-image data to the recorded data. The optional non-image data acquisition unit 42 obtains supplementary data of the types described herein for inclusion with the stored image data and presents the supplementary data to user interface unit 40. Design of actual circuitry to implement the functions of user interface unit 40 and non-image data acquisition unit is a trivial exercise for a skilled digital designer.

The input signal processing unit 44 prepares the digital data prepared by the image capture unit 38 for transfer to the holographic storage system, e.g. by dividing the subject image into a stream of coded digital image pages. The input signal processing unit 44 is configured to carry out the steps of compressing the image, dividing the image into data pages, formatting the data pages, adding redundant data for error correction coding, and applying modulation codes. These functions are well known in the art, and the design of particular circuitry for performing these functions is a matter of routine circuit design. Exemplary encoding and decoding techniques for use with digital holographic storage of digital data are disclosed in U.S. Pat. Nos. 5,450,218 and 5,727,226, incorporated herein by reference.

According to another aspect of the present invention, it is contemplated that additional digital information can be recorded with the digital photo. A non-exhaustive illustrative list of examples of such data include, digital voice annotation, circumstances surrounding the photo (i.e., location, and exposure (f-stop, etc.)); and resolution information. Such additional digital information can be stored digitally integrated with photo data. Another example would be to record music for a music/photo combination.

The storage control unit 46 obtains the processed image and other digital data from input signal processing unit 44 and transfers that data to the holographic storage and retrieval subsystem 48. The storage control unit 46 several tasks with respect to the holographic storage and retrieval system 48, including sending data to an SLM, controlling the reference beam and positioning the medium. As will be appreciated by persons of ordinary skill in the art, the imager capture unit 38, the input signal processing unit 44, and/or the storage control unit 46 may utilize a buffer to facilitate efficient data transfer.

The retrieval control unit 50 receives data from the holographic storage and retrieval subsystem 48. The retrieval control unit 50 performs several tasks with respect to the holographic storage and retrieval system 48, including collecting data from a detector, controlling the reference beam, and positioning the medium. As will be appreciated by persons of ordinary skill in the art, the retrieval control unit 50, the output signal processing unit 52, the optional display 56, and/or the output port 54 may utilize a buffer to facilitate efficient data transfer.

The output signal processing unit 52 can carry out several steps to decode data retrieved by retrieval control unit 50, including interpreting page formats, interpreting modulation coding, decoding error corrected segments, assembling images from data, and decompressing images. The output data, which can also include non-image data, can be directed to an output port 54 or an optional display 56.

Figure 4:
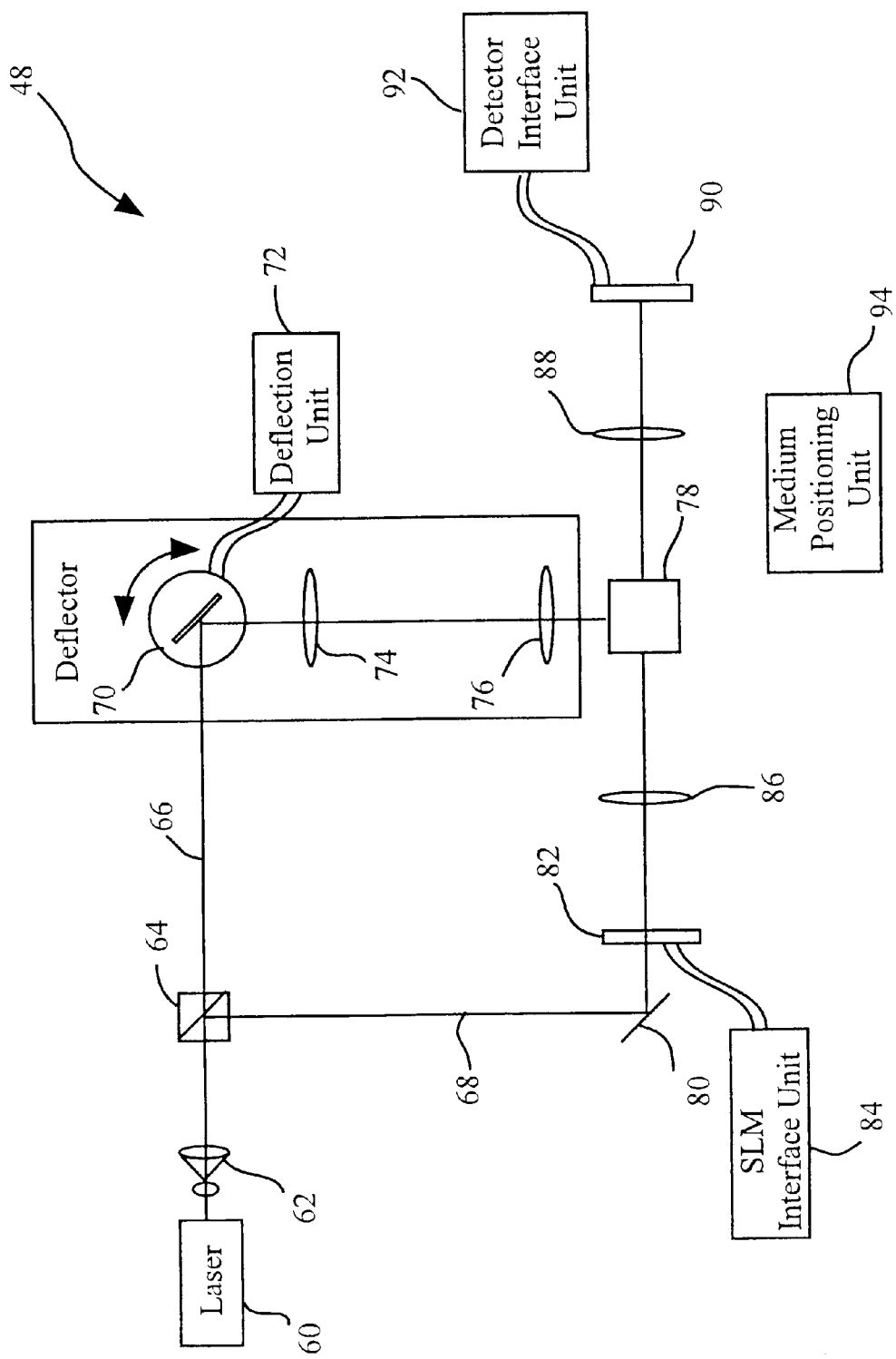
FIG. 4 is a diagram of an illustrative digital holographic storage subsystem suitable for recording images in the camera of FIG. 3 according to the present invention.

Referring now to FIG. 4, a diagram of an exemplary holographic storage and retrieval subsystem according to the present invention is shown. The general operation of a holographic storage system, such as that of FIG. 4A, is described in U.S. Pat. No. 5,450,218. Briefly, for holographic storage systems in general, coherent light from a laser is divided into two paths, a signal beam path and a reference beam path. These paths may be separately controlled by shutters, as required. A signal beam is encoded using a spatial light modulator (SLM), which can be controlled by an SLM interface unit. The signal beam is generally collimated before being encoded with an SLM. The SLM can be, for example, a digital micromirror device or an array of liquid crystal cells, which are well known. Such devices generally define a matrix of pixels. The SLM interface unit loads data onto the SLM. As is well known to persons of ordinary skill in the art, the reference beam angle can be controlled using standard optics and deflectors and can be controlled by a beam-positioning unit. The reference beam and the signal beam are simultaneously incident on a photosensitive medium capable of recording holograms. Persons of ordinary skill in the art will also recognize that the subsystem of FIG. 4 may be modified to accommodate a digital micromirror device that operates in reflection mode.

Numerous holographic materials are suitable for use in the present invention and include, without limitation, photopolymers, photorefractive crystals, and photosensitive glasses. Photorefractive crystals and glass tend to have substantial thickness, and photopolymers tend to be thin. Photopolymers are presently preferred for permanent storage. For information on photopolymers see, for example, Lessard and Manivannan (ed.), Selected Papers on Photopolymers, SPIE Milestone Series, V. MS-114, SPIE Optical Engineering Press, Bellingham, Washington, 1995. See also U.S. Pat. No. 5,759,721 to Dahl et al.

Because the signal and reference beams are arranged to be mutually coherent on the photosensitive medium, they generate an interference pattern that then alters the complex index of refraction of the material, recording a hologram.

Multiple holograms can be stored in the same physical location in the medium 12 by changing the properties of the reference beam. Such changes can be achieved using a variety of techniques, such as angle multiplexing, in which holograms can be stored using reference beams with different incident angles (see, e.g., U.S. Pat. No. 5,450,218); wavelength multiplexing, in which different holograms can be recorded using different laser wavelengths (see, e.g., U.S. Pat. No. 5,440,669); shift multiplexing, in which a complex reference beam can be used to record different holograms different positions of the medium, where the illuminated portions of the medium overlap substantially (see, e.g., U.S. Pat. No. 5,671,073); and phase-encoded multiplexing, in which the reference beam is encoded with a spatial-light modulator that controls the phase front of the reference beam. A review of several of such known multiplexing techniques may be found in "Optical memories implemented with photorefractive media," L. Hesselink and M. C. Bashaw, Optical and Quantum Electronics 25, S611–S661.

In addition, holograms can be stored at different locations as well. Locations can be selected by modifying reference beam optics to include beam-position manipulation elements to position the light beams to different locations (see, e.g., U.S. Pat. No. 5,550,779) or by moving the medium in its holder (see, e.g., U.S. Pat. No. 5,519,517). For angular multiplexing, the angle of the reference beam is controlled by the beam control unit. The position of the medium in its holder can be controlled by a media positioning unit. The medium may include fiducial marks to assist in positioning, as described, for example, in U.S. Pat. No. 5,519,517. Persons of ordinary skill in the art will be able to include hardware to detect fiducial marks.

Data are represented as follows. Generally, a channel bit represents the lowest level of data storage in a data storage device. In traditional storage devices, a channel bit can be represented by the changes in the property of a material. In magneto-optical storage, for example, the channel bit can be represented by a magnetic domain orientation or the point of transition from one domain to another. In a holographic storage system, a channel bit can be represented by the values of pixels; for example, "on" and "off" pixels can represent channel bits "1" and "0", respectively. Groups of data bits can be represented by groups of channel bits using modulation codes, which are well known in the art. See, for example, U.S. Pat. No. 5,450,218 and U.S. Pat. No. 5,727,226 for descriptions of modulation codes. Data bits can be modified with error correction codes to improve the bit-error rates of a holographic storage system. Error correction coding and modulation encoding are generally performed before loading data onto an SLM display. Modulation decoding and error correction decoding are generally performed after retrieving data from the detector elements.

To retrieve a hologram, the reference beam is incident on the medium. The reference beam used to retrieve a hologram generally corresponds to the reference beam used to record a particular hologram. For angle multiplexing, different reference beam angles are used to retrieve different holograms. The reference beam diffracts off of the hologram to generate the output signal beam, which is then incident on a detector; the detector generally comprises a matrix of pixels. The detector can be controlled by a detector interface unit, which retrieves data from the detector. The detector can be, for example, a CCD detector array or a CMOS detector array, which are well known.

In the holographic storage and retrieval system depicted in FIG. 4A, laser 60 enters beam expander 62. The output of beam expander 62 is fed to beam splitter 64 which splits the expanded beam into two paths shown at reference numerals 66 and 68.

Beam 68 is a reference beam and is deflected by deflector 70, controlled by deflection unit 72, and passed through lenses 74 and 76 to holographic medium 78. The spacing between SLM 82 and lens 86 and lens 86 and medium 78 may both be about f, where f is the focal length of the lens 86. This arrangement generally provides the highest storage density. The medium may be slightly displaced from the focal length f to avoid bright features in the focus of the signal beam in the medium. Alternatively, persons of ordinary skill in the art may use a phase mask placed adjacent to the SLM to avoid bright features in the focus of the signal beam at medium 78. Beam 68 is deflected by mirror 80 and passed through spatial light modulator (SLM) 82, controlled by SLM interface unit 84. The SLM interface unit passes data from the storage control unit 46 of FIG. 3 to the SLM 82. The modulated beam is passed through lens 86 to medium 78, where it coincides with reference beam 66.

For reading stored holographic digital data from medium 78, lens 88 and detector 90 are employed. In the subsystem depicted in FIG. 4A, the spacing between medium 78 and lens 88 and between lens 88 and detector 90 can both be about f' where f' is the focal length of lens 88. The detector interface unit 92 passes data from the detector 90 to the retrieval control unit 50 of FIG. 3. The detector control unit 92 is generally similar to the image capture unit 38 of FIG. 3, but will usually have a different configuration.

With respect to the reference beam optics, lens 74 and lens 76 have focal lengths of f" and f"' respectively. The deflector 70 is located at a distance f" from lens 74. Lens 74 and lens 76 are separated by a distance f"+f"'. Lens 76 is separated from medium 78 by a distance of f"'. This arrangement of optical components ensures that the reference beam remains positioned in place at the medium 78 as its angle changes.

In alternative embodiments, some of the output signal processing functions, such as modulation decoding, can be performed in the detector control unit 92. For example, a data control unit operating in conjunction with a detector having on-chip modulation decoding, may transfer binary data.

The storage control unit 46 of FIG. 3 performs the tasks of loading data into the SLM 82 via its interface unit 84, controlling the reference beam 66, and positioning the medium using medium positioning unit 94.

Figure 5:
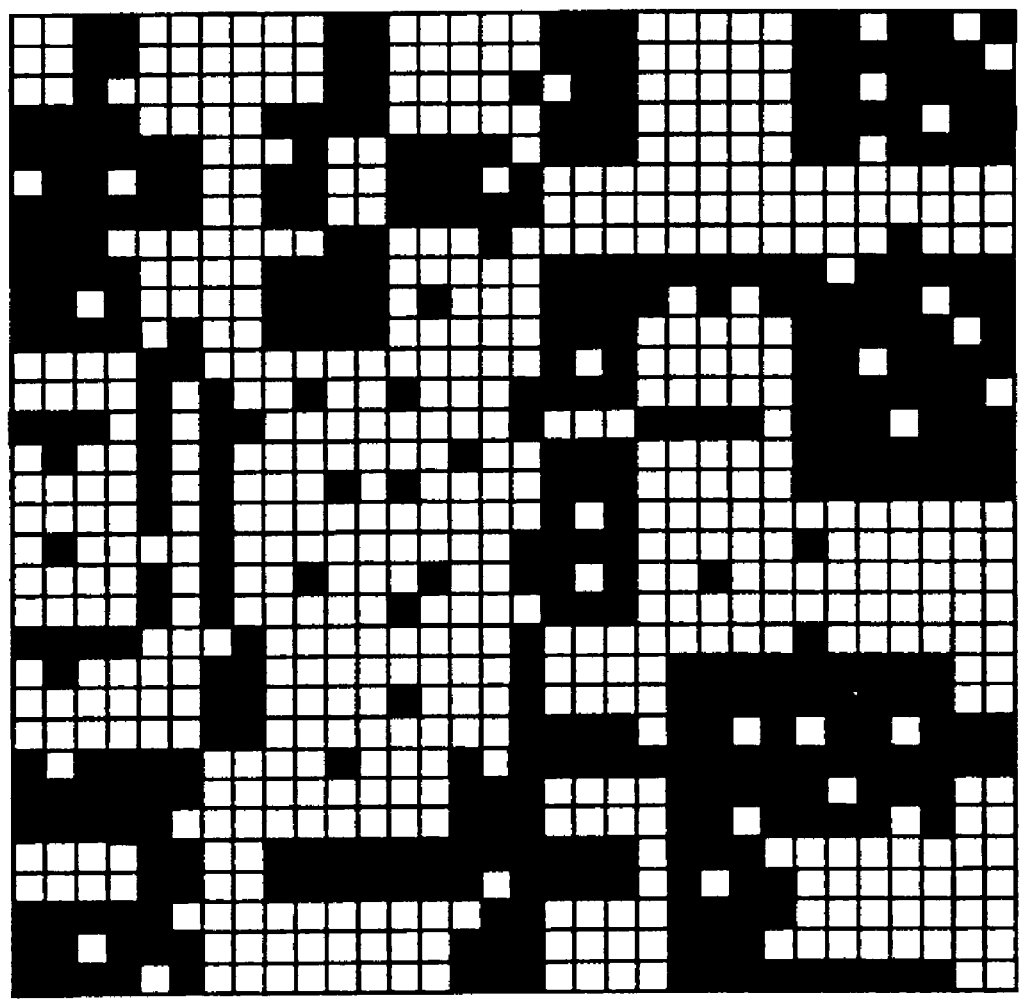
FIG. 5 is a diagrammatic representation of a page of digital holographic image data such as would be produced by the system of the present invention.

Referring now to FIG. 5, a schematic representation is shown of a page of holographically-stored digital data such as would be produced by the system of the present invention. In FIG. 5, black areas represent storage of the binary value of "zero" while white areas represent storage of the binary value of "one." Each digital page is organized in the following manner. A page format determines the method for organizing bits on the page. Page formatting can comprise data interleaving and/or designation of data sectors. The page can be formatted to contain designated areas that provide information to identify the page and to align the digital image. Error correction codes and modulation codes are used to convert the digital data in the electronics to digital holographic page format. The pages are then individually stored. Total recording times can be on the order of a millisecond or less per page, and total recording times can be less than about one second.

According to another aspect of the present invention, holographic storage subsystems are disclosed. Referring now to FIGS. 6A through 6D, four different illustrative embodiments of holographic storage subsystems are depicted. Elements of these drawing figures having similar structure and functions as counterpart elements in the holographic storage and retrieval subsystem depicted in FIG. 4 will be given the same reference numerals as the corresponding elements in FIG. 4.

Figure 6A:
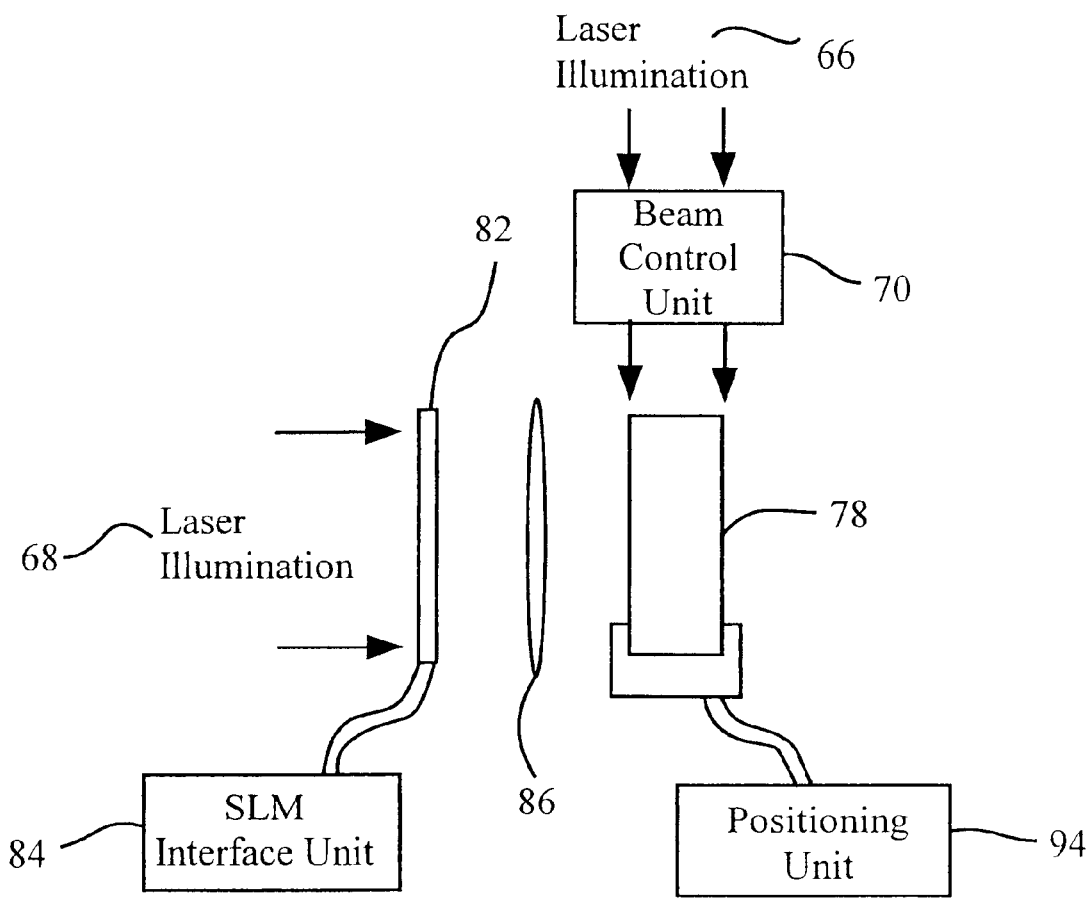
FIGS. 6A through 6D are diagrams of alternate embodiments of digital holographic media recording subsystems that may be usefully employed in the present invention.

In FIG. 6A, SLM data encoder 82 encodes information onto incoming laser beam 68 under control of SLM interface unit 84. The encoded beam is focused by lens 86 onto medium 78, which may be a block of holographic material. Beam control unit 70 (i.e., a deflector) controls the positioning of reference beam 66 onto medium 78 and in particular its incident angle. The position of medium 78 is controlled by positioning unit 94. The distances between SLM encoder 82 and lens 86 and between objective lens 86 and medium 78 may both be equal to focal length f of lens 86. the objective lens 86 focuses light from the SLM into the medium. The medium may be slightly displaced from the focal length f to avoid bright features in the focus of the signal beam in the medium. Alternatively, persons of ordinary skill in the art may use a phase mask placed adjacent to the SLM to avoid bright features in the focus of the signal beam at medium 78.

Figure 6B:
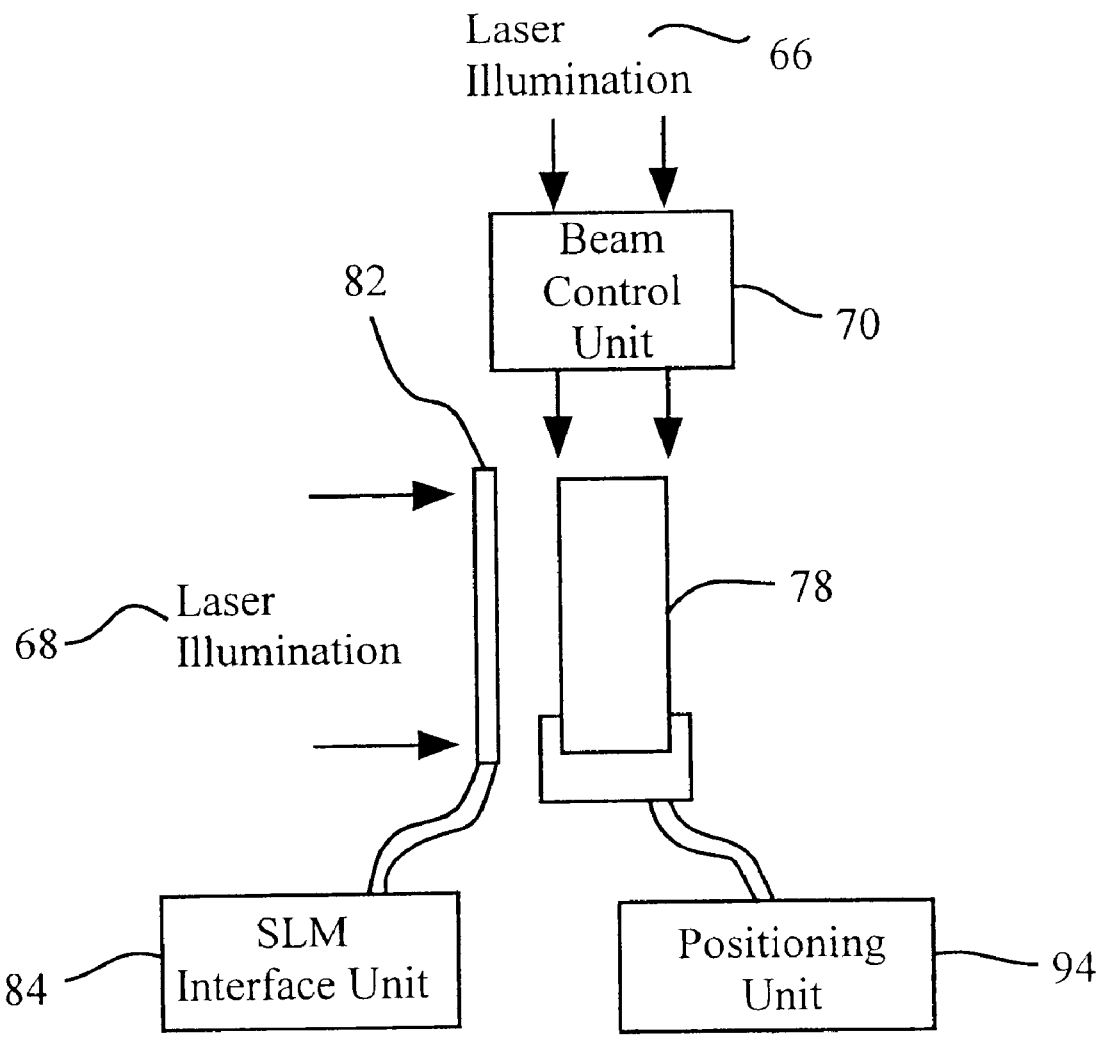
Figure 6C:
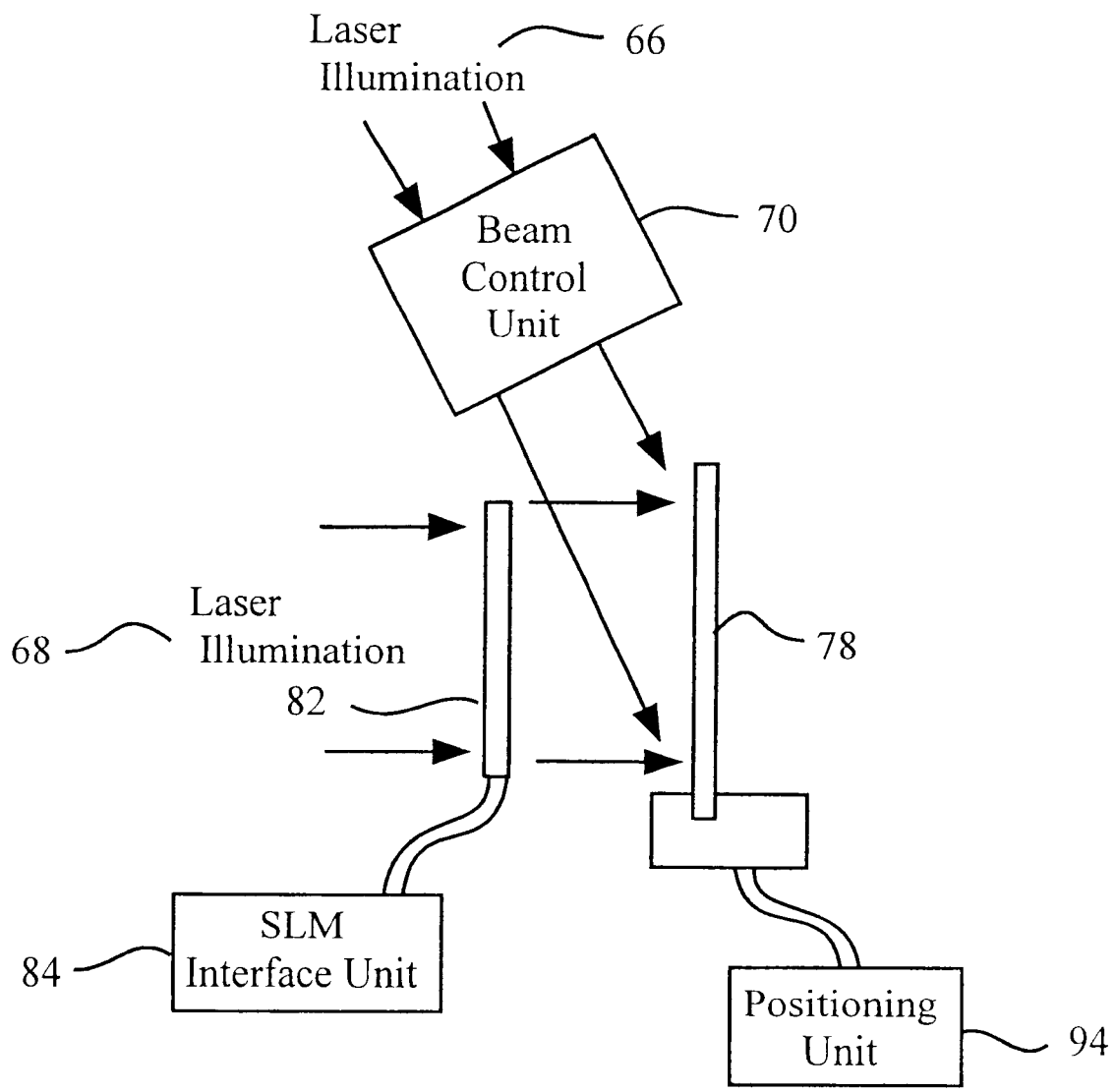
Figure 6D:
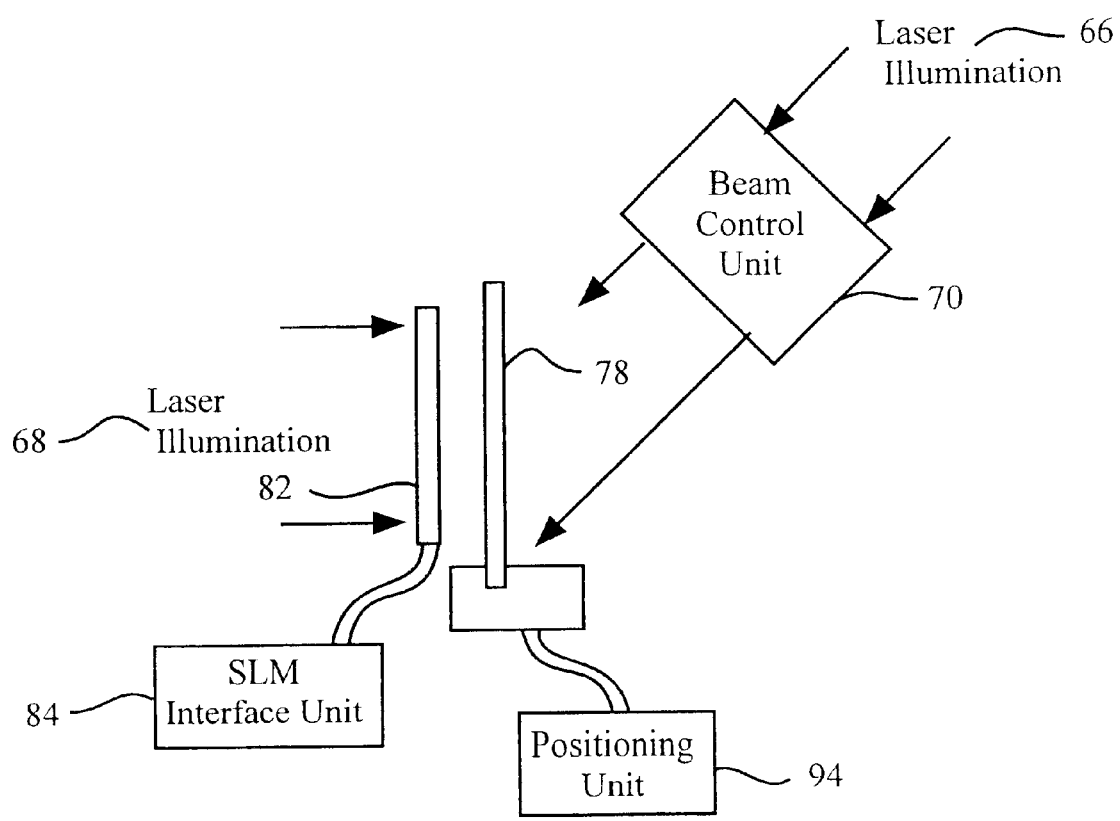

In FIG. 6B, an embodiment without an objective lens, the SLM data encoder can be placed close to the medium 78. As in the embodiment of FIG. 6A, beam control unit 70 (i.e., a deflector) controls the positioning of reference beam 66 onto medium 78. The position of medium 68 is controlled by positioning unit 94. FIG. 6C and 6D show two different implementations that employ thin media 78, in which the SLM data encoder is as close to the medium as possible.

The difference between the embodiments of FIGS. 6C and 6D is that in the embodiment of FIG. 6C the reference beam 66 is incident to the front side of medium 78 and in the embodiment of FIG. 6D the reference beam 66 is incident to the rear face of the medium 78. Persons of ordinary skill in the art will appreciate that thin media such as employed in the embodiments of FIGS. 6C and 6D can be used with a lens, as in the embodiment of FIG. 6A. Such persons will also appreciate that the reference beam 66 may be used to illuminate the front and rear sides of medium 78 as in the embodiments of FIGS. 6C and 6D.

In comparison, FIG. 6A illustrates a subsystem for high capacity. FIG. 6B illustrates a compact, subsystem without an objective lens. FIG. 6C illustrates a compact subsystem suitable for employing thin media, utilizing transmission geometry, which is most resistant to shrinkage. FIG. 6D also illustrates a compact subsystem suitable for employing thin media, but utilizes reflection geometry. The embodiment of FIG. 6D offers greater compactness than the system of FIG. 6C but is generally less tolerant to shrinkage.

A method for recording digital images according to the present invention is illustrated in the flow diagram of FIG. 7A. As shown in FIG. 7A, the subject is first focused onto a digital image detector, such as a CCD array. The detector captures the image at step 100. At step 102 the image is digitized. At step 104, the digitized image is divided into a stream of coded digital image pages. This step may include merging other data in addition to the data representing the image itself as disclosed herein. At step 106 the digital image pages are loaded into the SLM and are stored in the medium at step 108. Persons of ordinary skill in the art will appreciate that the digital pages are loaded and stored one at a time.

Referring now to FIG. 7B, a flow diagram shows a more detailed method for capturing and storing digital holographic images according to the present invention. First, at steps 110 and 112, the digital image is captured by the imaging array and digitized. These steps are essentially the same as steps 100 and 102 of FIG. 7A. Next, at step 114, the image data is compressed, using any one of numerous known data compression algorithms. At step 116, the compressed data is divided into pages, which are formatted in step 118. Formatting may comprise data interleaving and designation of data sections, and defining pixel regions dedicated to recording data. At step 120, error correction coding is performed and in step 122 modulation coding is performed to generate the paginated data. Error correction coding generally operates by adding redundant bits to a stream of data bits. The redundancy allows for the detection and correction of one or more bit errors, according to the details of the error correction code. Error correction codes are well known in the data storage and processing art, and known schemes can be applied to the digital holographic data of the present invention. At steps 124 and 126, the prepared data is loaded into the SLM and written to the medium one page at a time as in the method of FIG. 7A.

Modulation codes are used to map data bit sequences into channel bit sequences. Generally, modulation codes use channel bit sequences that improve the error rate over arbitrary bit sequences. Several illustrative modulation codes are described in U.S. Pat. Nos. 5,450,218 and 5,727,226.

Channel bits are modulation decoded and resulting data bits error correction decoded to generate data bits. These data bits are sequentially arranged to account for any data formatting used during recording. Data from a digital image page is assembled into a digital image, which is decompressed and then routed to its next destination. This next destination can be a variety of devices that could benefit from either an external reader or from an embedded reader, including computers, printers, display devices, a storage device with an internet port, a storage device with a telecommunications port, an information appliance, etc.

Figure 8A:
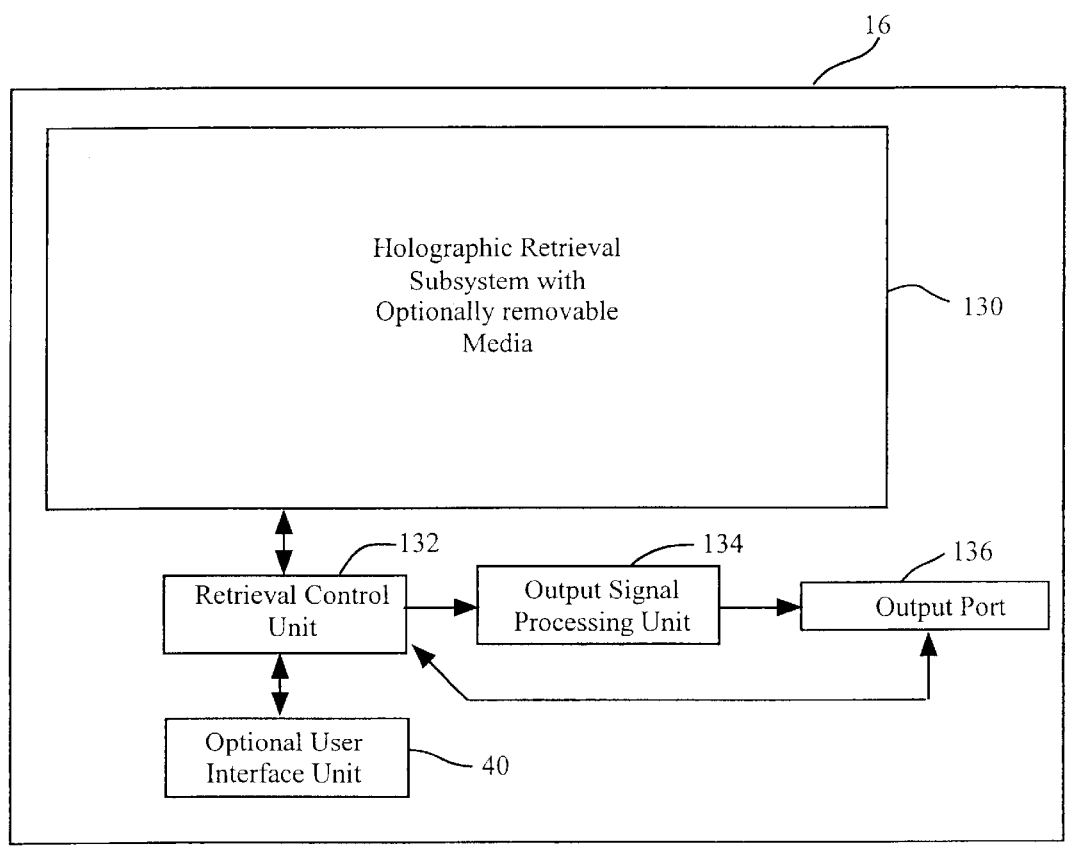
FIG. 8A is a block diagram of an illustrative embodiment of a digital holographic media reader according to the present invention.

According to another aspect of the present invention, a stand-alone reader is disclosed. Referring now to FIG. 8A, a block diagram of an illustrative embodiment of a holographic digital image reader 16 of FIG. 1 is shown. Reader 16 includes a holographic retrieval system 130 into which a removable digital holographic storage medium may be placed for image retrieval. The holographic retrieval system 130 is controlled by retrieval control unit 132, which generates the control signals needed to operate the elements holographic retrieval system 130. The output data from retrieval port 136, to which a viewing or printing device or computer may be coupled. The optional user interface unit 40 functions to select desired images to retrieve and direct to the output port.

Figure 8B:
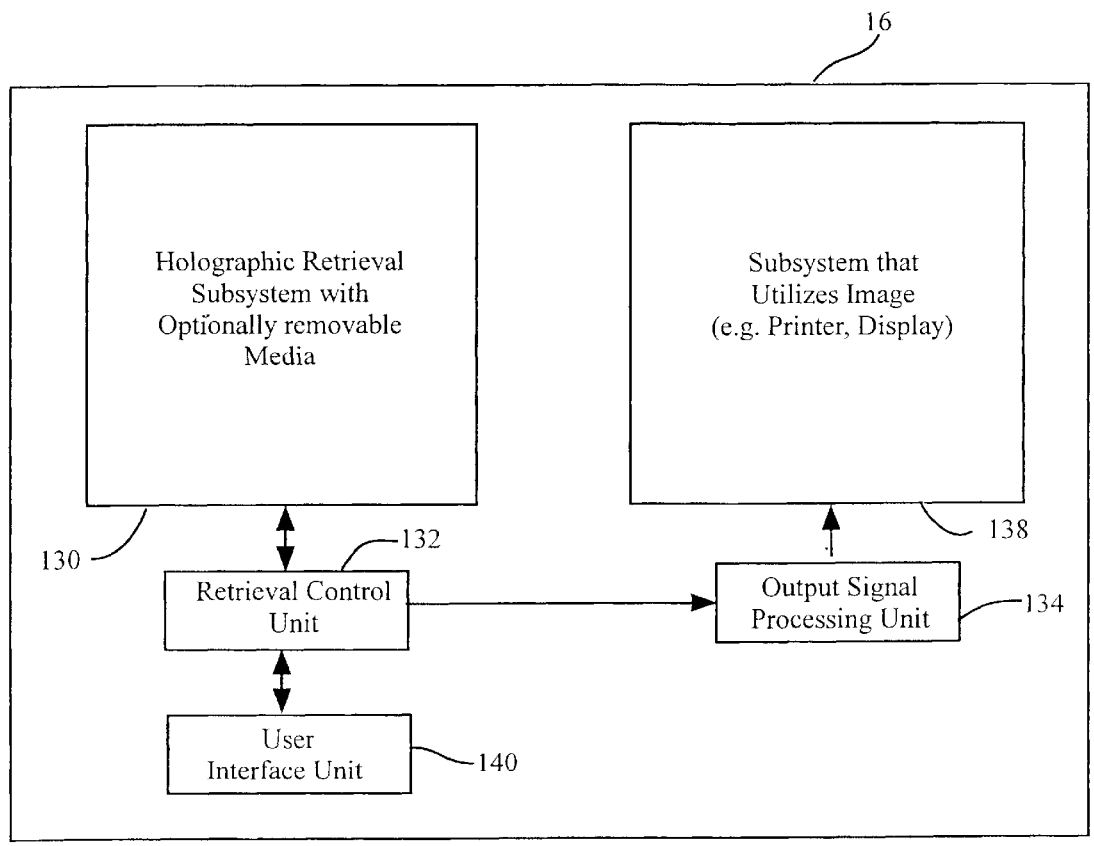
FIG. 8B is a block diagram of an illustrative embodiment of a digital holographic media reader according to the present invention further including a subsystem that utilizes the images.

Referring now to FIG. 8B, a block diagram of an illustrative embodiment of another holographic digital image reader 16 of FIG. 1 is shown. Like the embodiment depicted in FIG. 8A, the embodiment of FIG. 8B includes a holographic retrieval subsystem 130 into which a removable digital holographic storage medium may be placed for image retrieval. The holographic retrieval subsystem 130 is controlled by retrieval control unit 132, which generates the control signals needed to operate the elements holographic retrieval system 130. The output data from retrieval control unit 32 is processed by output signal processing unit 134. The embodiment of FIG. 8B differs from that shown in FIG. 8A because it includes an image utilization subsystem 138, such as a display or printer. A user interface 140 is provided to select which photo to display, print, etc.

In both the embodiments of FIGS. 8A and 8B, when the medium is inserted into the reader, an appropriate position of the medium is addressed. A laser generates a reference beam, which illuminates the medium. The output digital image pages are preferably retrieved sequentially by moving corresponding portions of the media into position and selecting the appropriate reference beam (e.g. beam angle, beam phase code, beam speckle code, or beam wavelength). The output portion of the signal is reconstructed and imaged onto a detector array. The detector array may be a CCD array, a CMOS detector array, or any other suitable array. The signal may contain alignment marks to facilitate alignment of the output image with the detector array.

Referring now to FIGS. 9A through 9D, block diagrams of illustrative alternate embodiments of holographic retrieval subsystems to read out image data according to the present invention are presented. The geometry of each of the holographic retrieval subsystems of FIGS. 9A through 9D is matched to the geometry of a corresponding one of the four different illustrative embodiments of holographic storage subsystems depicted in FIGS. 6A through 6D. Elements of these drawing figures having similar structure and functions as counterpart elements in the holographic storage and retrieval subsystem depicted in FIG. 4 will be given the same reference numerals as the corresponding elements in FIG. 4. Generally, for holographic subsystems, the focal length and position of an output lens in a reader is selected to image the retrieved pixels onto the data detector.

Figure 9A:
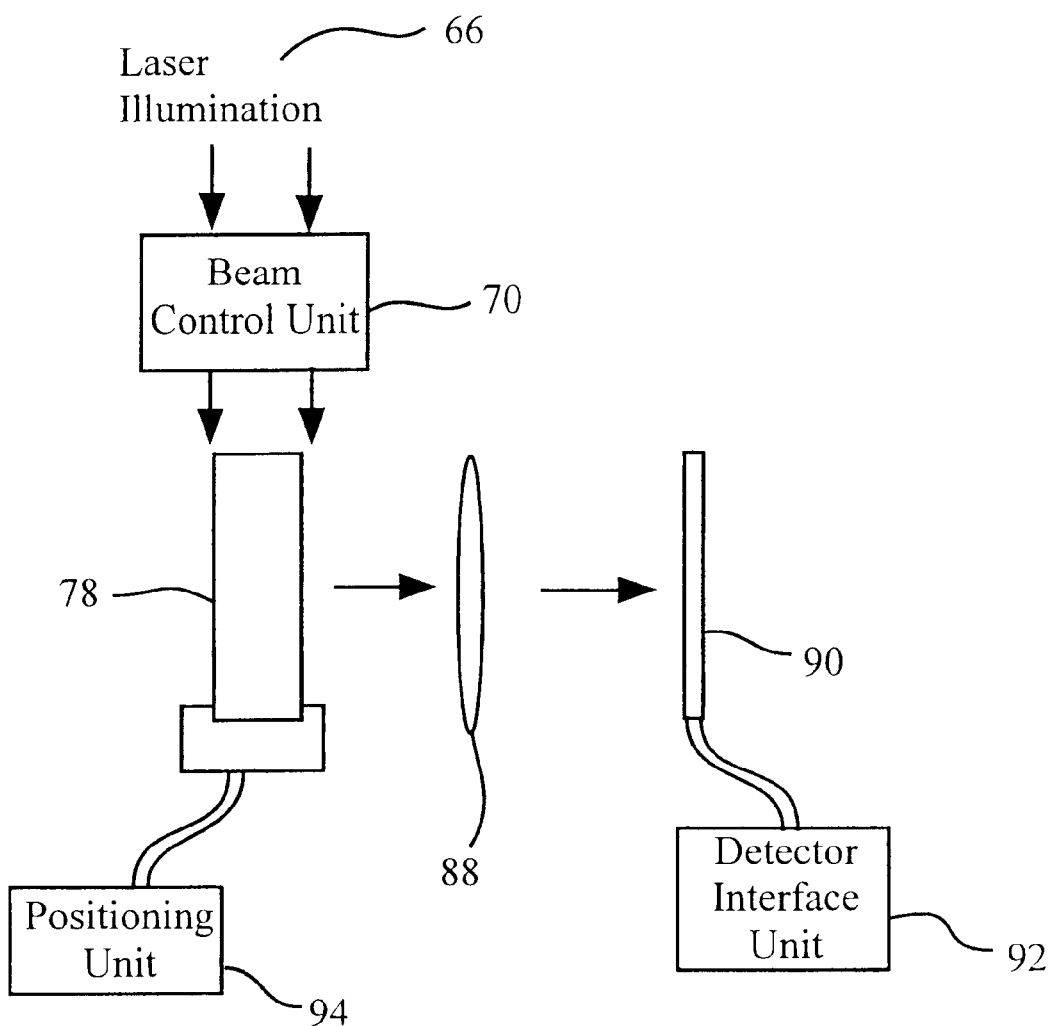
FIGS. 9A through 9E are block diagrams of illustrative alternate embodiments of holographic retrieval subsystems to read out image data according to the present invention.

Referring first to FIG. 9A, holographic retrieval subsystem 130 is seen to include medium 78 that receives laser reference beam 66. Beam control unit 70 and positioning unit 94 are used to direct the beam 66 to the desired location on medium 78 at a desired angle of incidence. Light output from medium 78 is focused through lens 88 to data detector 90. The data from data detector 90 is read by detector interface unit 92.

The holographic retrieval subsystem of FIG. 9A corresponds to the storage subsystem of FIG. 6A and so the distance between medium 78 and lens 88, and lens 88 and data detector 90 may both be equal to the focal length f' of lens 88 when the distances between SLM 82, lens 86, and medium 78 are equal to focal length f of lens 86. To retrieve a recorded data page, the angle of incidence of the laser reference beam 66 in FIG. 9A generally correspond to the angle of incidence of the laser reference beam in FIG. 6A used to record that page. For negligible material shrinkage and negligible change in the mean index of refraction, these angles are generally the same.

Figure 9B:
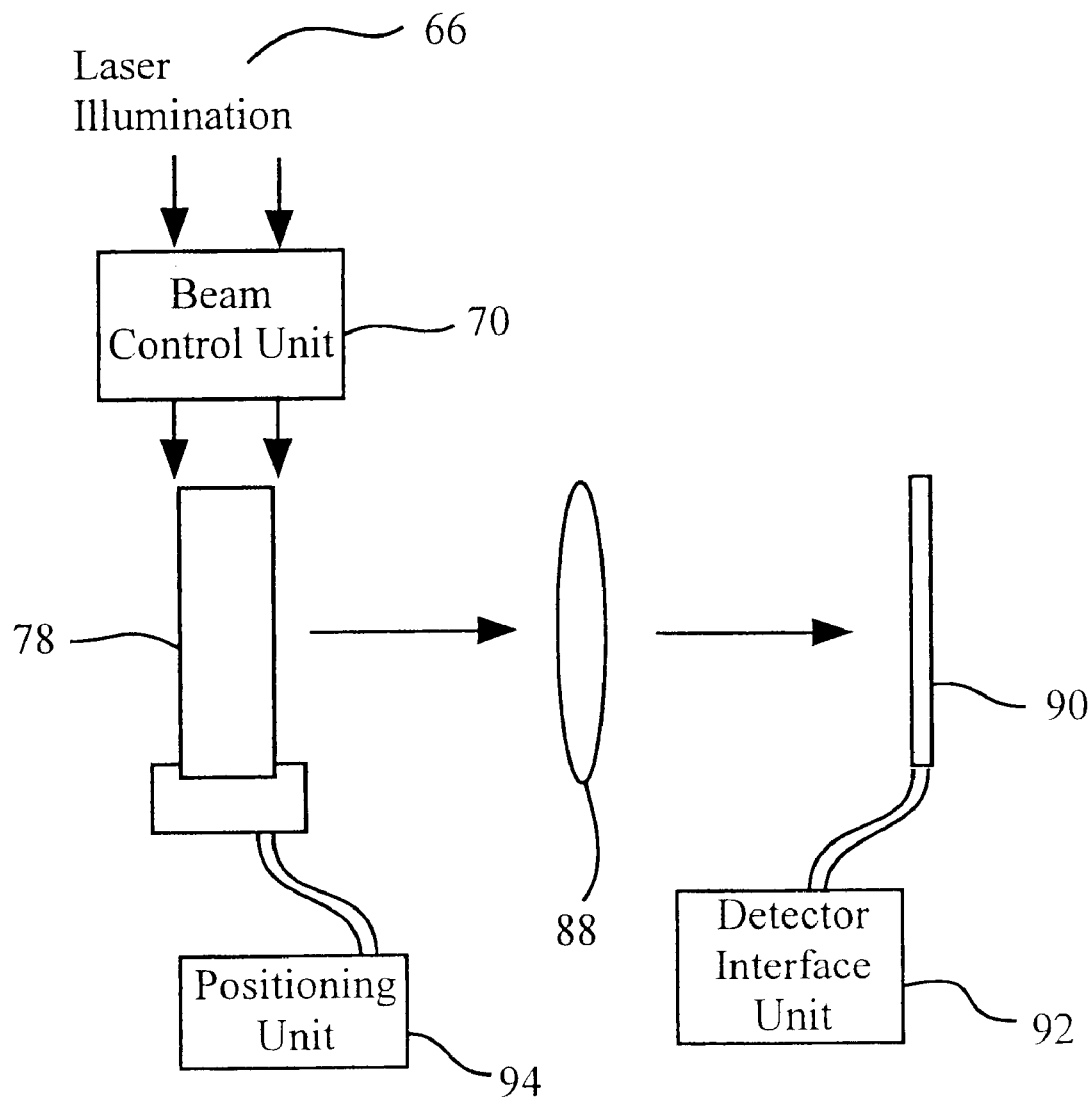

Referring now to FIG. 9B, holographic retrieval subsystem 130 is also seen to include medium 78 that receives laser reference beam 66. Beam control unit 70 and positioning unit 94 are used to direct the beam 66 to the desired location on medium 78 at a desired angle of incidence. Light output from medium 78 is focused through lens 88 to data detector 90. The data from data detector 90 is read by detector interface unit 92.

The holographic retrieval subsystem of FIG. 9B corresponds to the storage subsystem of FIG. 6B and lens 88 is placed to image the output pixels onto detector 90 as is well known in the art. For one-to-one imaging, for example, when the SLM 82 is adjacent to the medium during storage, the lens is situated about 2f from the virtual position of the SLM 82 adjacent to the medium and about 2f from the detector 90. A virtual image of the pixel array is located at the virtual position of the SLM 82. To retrieve a recorded data page, the angle of incidence of the laser reference beam 66 in FIG. 9B generally corresponds to the angle of incidence of the laser reference beam in FIG. 6B used to record that page. For negligible material shrinkage and negligible change in the mean index of refraction, these angles are generally the same.

Figure 9C:
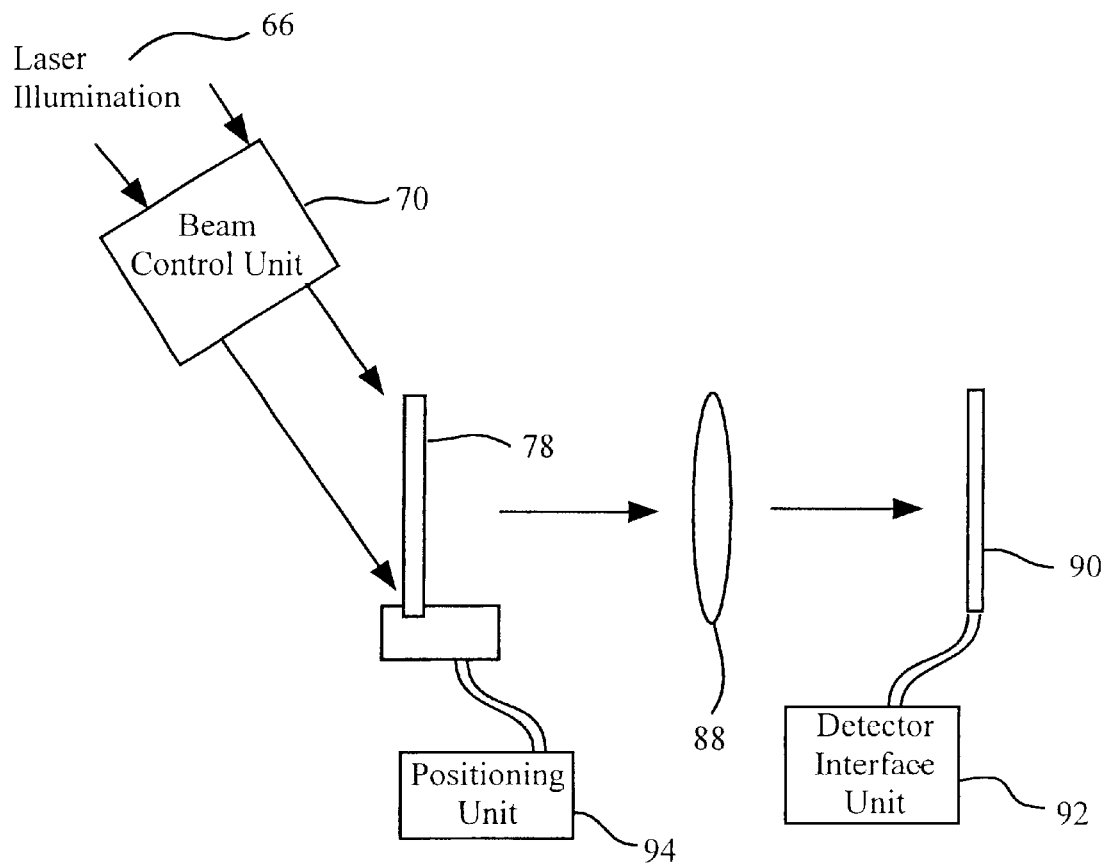

Referring to FIG. 9C, holographic retrieval subsystem 130 is also seen to include medium 78 that receives laser reference beam 66. Beam control unit 70 and positioning unit 94 are used to direct the beam 66 to the desired location on medium 78 at a desired angle of incidence. Light output from medium 78 is focused through lens 88 to data detector 90. The data from data detector 90 is read by detector interface unit 92.

The holographic retrieval subsystem of FIG. 9C corresponds to the storage subsystem of FIG. 6C in that the output lens is situated in a position similar to that of the embodiment of FIG. 9B. To retrieve a recorded data page, the angle of incidence of the laser reference beam 66 in FIG. 9C generally corresponds to the angle of incidence of the laser reference beam in FIG. 6C used to record that page. For negligible material shrinkage and negligible change in the mean index of refraction, these angles are generally the same.

Figure 9D:
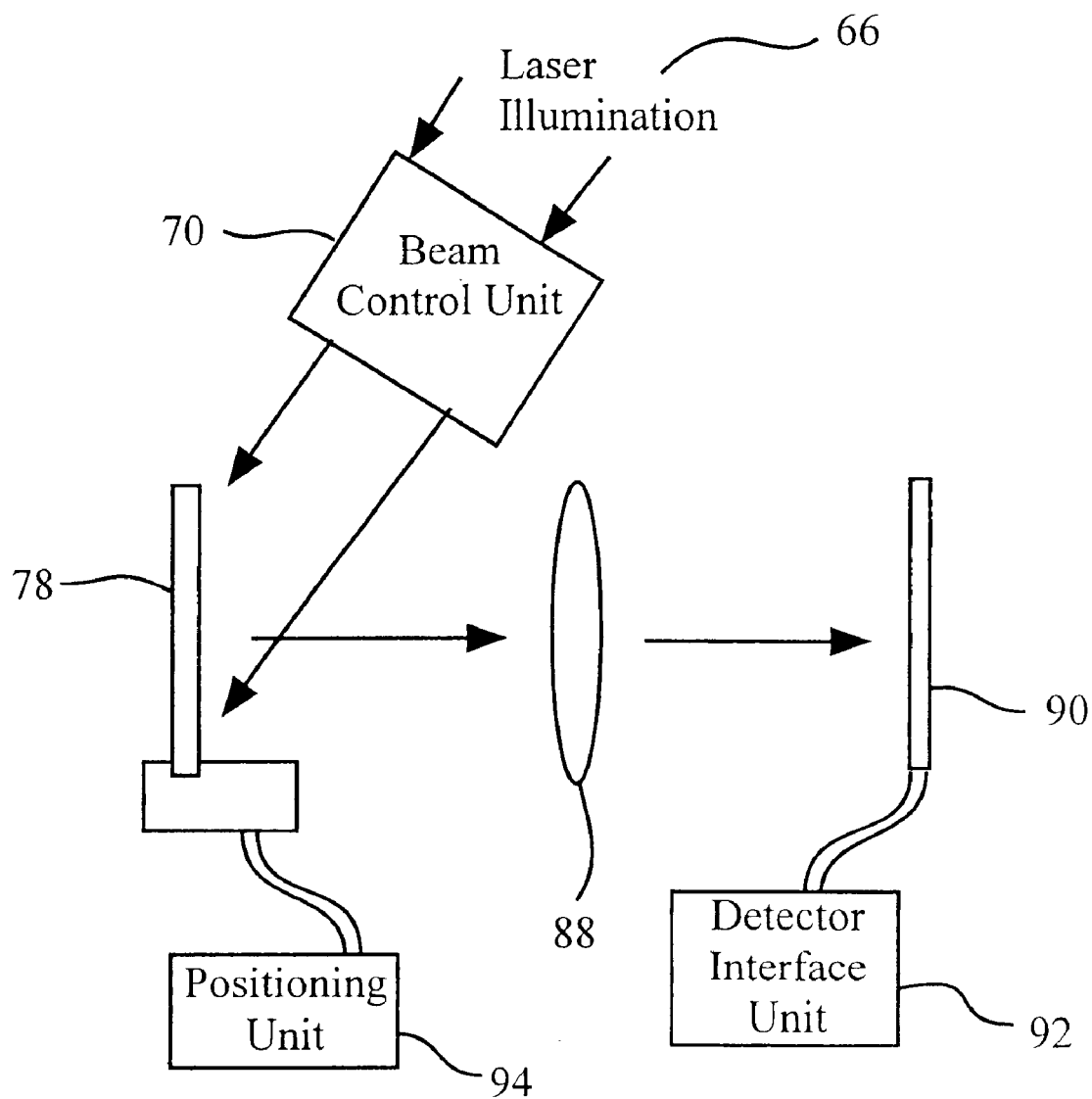

Referring to FIG. 9D, holographic retrieval subsystem 130 includes medium 78 that receives laser reference beam 66. Beam control unit 70 and positioning unit 94 are used to direct the beam 66 to the desired location on medium 78 at a desired angle of incidence. Light output from medium 78 is focused through lens 88 to data detector 90. The data from data detector 90 is read by detector interface unit 92.

The holographic retrieval subsystem of FIG. 9D corresponds to the storage subsystem of FIG. 6D and the lens 88 is placed to image the output pixels onto detector 90. To retrieve a recorded data page, the angle of incidence of the laser reference beam 66 in FIG. 9B generally corresponds to the angle of incidence of the laser reference beam in FIG. 6B used to record that page. For negligible material shrinkage and negligible change in the mean index of refraction, these angles are generally the same.

Figure 9E:
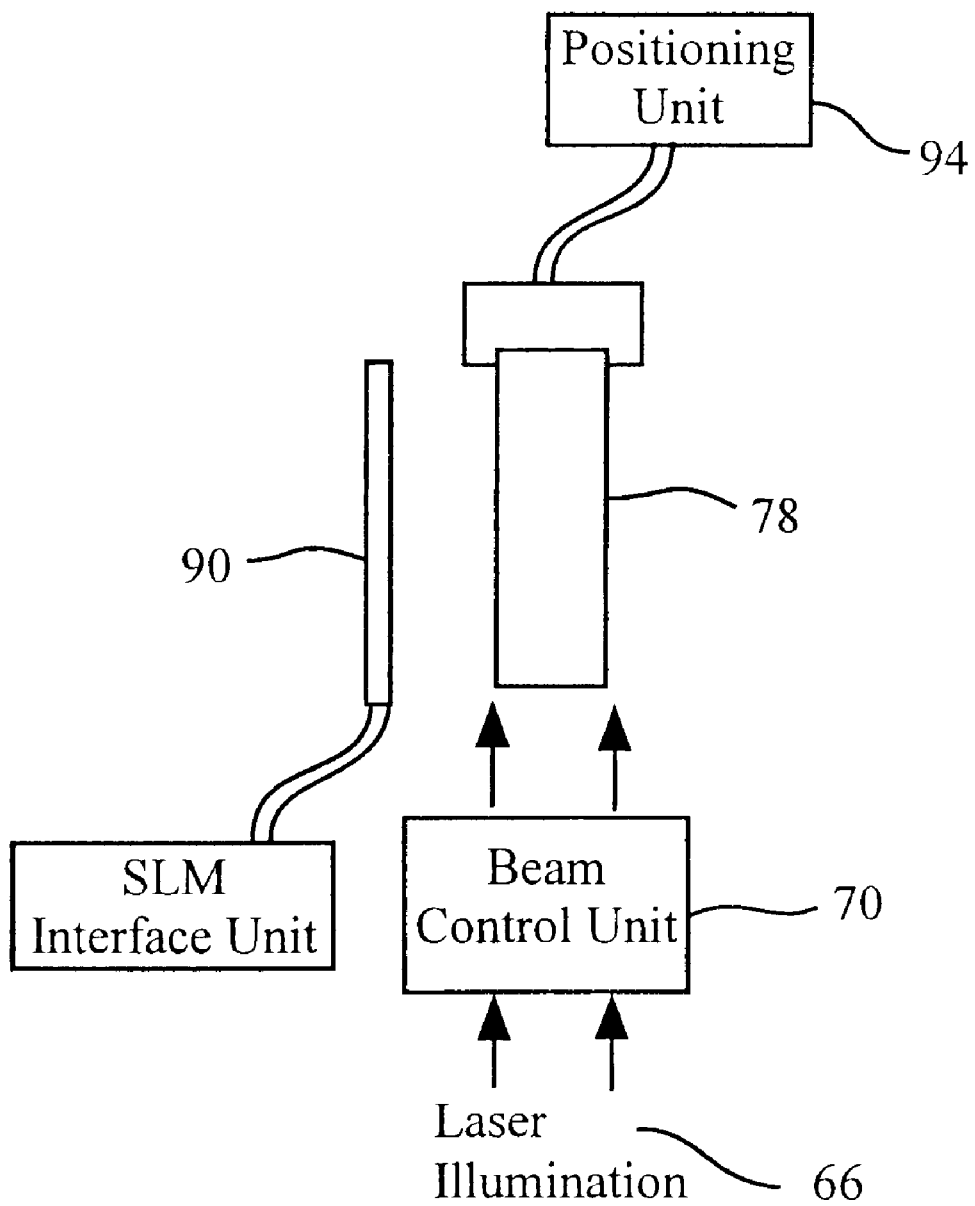

Referring now to FIG. 9E, a lenseless embodiment of a holographic retrieval subsystem 130 includes medium 78 that receives laser reference beam 66. Beam control unit 70 and positioning unit 94 are used to direct the beam 66 to the desired location on medium 78 at a desired angle of incidence. Light output from medium 78 is directed to data detector 90 disposed to the left of medium 78 in FIG. 9E. The data from data detector 90 is read by detector interface unit 92. In this embodiment, the medium 78 is located at essentially the same place in relation to the detector 90 as it had been in relation to the SLM 82 during recording. To retrieve a recorded data page, the angle of incidence of the laser reference beam 66 in FIG. 9D generally corresponds to the angle of incidence of the laser reference beam in FIG. 6D used to record that page. For negligible material shrinkage and negligible change in the mean index of refraction, these angles are generally the same, and the readout beam is counterpropagating to the beam used to store data.

The holographic retrieval subsystem of FIG. 9E is an alternate embodiment of the holographic retrieval subsystem of FIG. 9B and thus corresponds to the storage subsystem of FIG. 6B. An advantage of using this embodiment is that no objective lens is required in the subsystem.

Referring now to FIGS. 10A and 10B, flow diagrams are presented of methods for retrieving digitally-stored holographic images from media according to the present invention. Referring first to FIG. 10A, at step 140 the image pages are read from the medium at the detector. Next, at step 142, the data from the image pages are loaded into a buffer. At step 144, the stream of coded image data is converted into readable image data. Finally, at step 146, the image data is transferred to a user device or display.

Referring now to FIG. 10B, steps 150 and 152 correspond to the same steps 140 and 142 in FIG. 10A. Steps 154 through 162 illustrate step 144 of FIG. 10A in more detail. Thus, at step 154, the format of the incoming data is interpreted. Next, at step 156, the modulated data is decoded. At step 158, the error correction coding is decoded. At step 160 the pages of data are assembled into an image data file and at step 162, the image data file is decompressed. Step 164 corresponds to the same step 146 in FIG. 10A.

Figure 11:
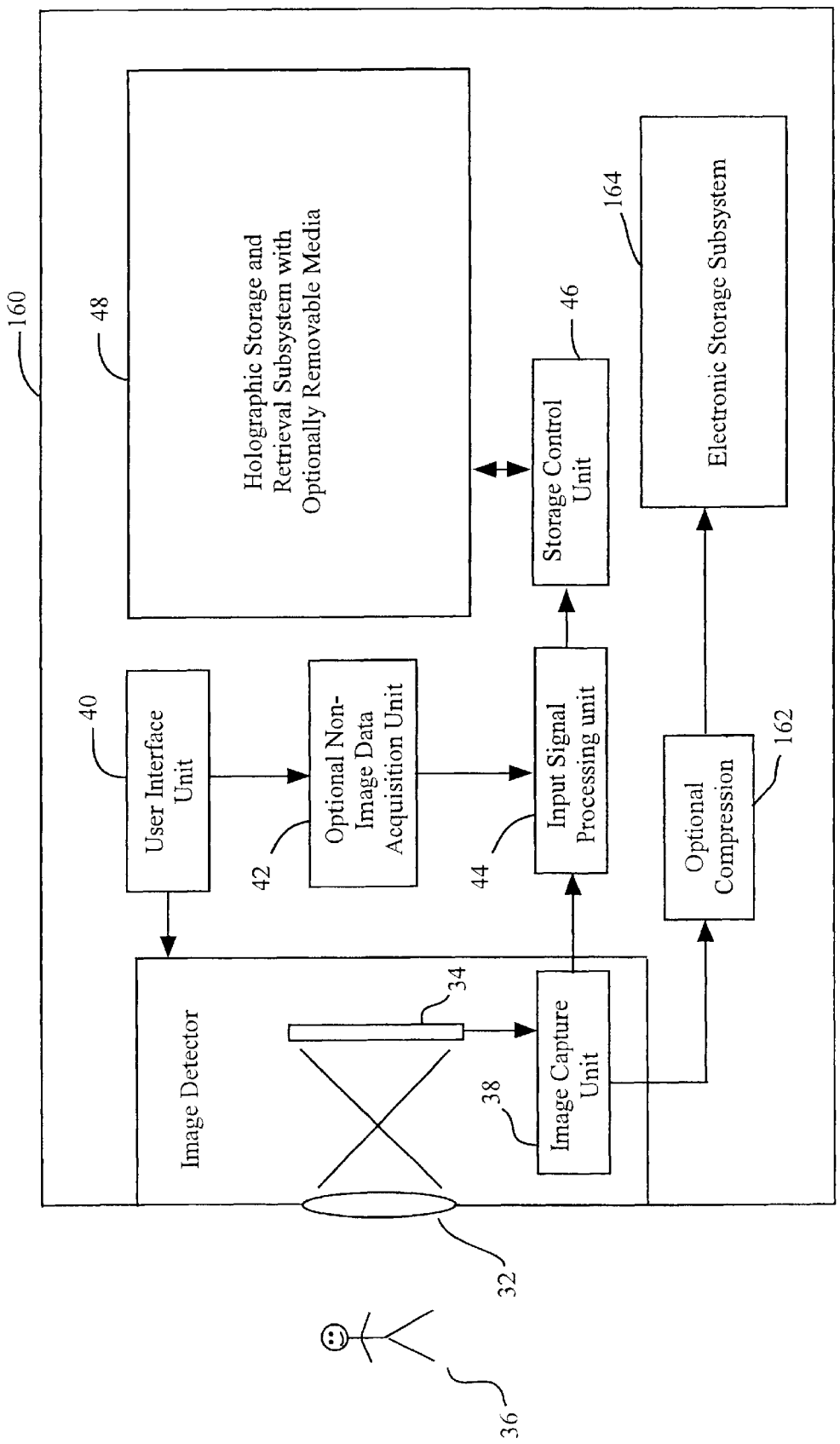
FIG. 11 is a block diagram of a digital holographic camera according to the present invention further including an electronic storage subsystem.

According to another aspect of the present invention, a camera employing digital holographic image storage as disclosed herein is also provided with an electronic storage subsystem. Referring now to FIG. 11, camera 160 includes many of the elements of the camera illustrated in FIG. 3, which will be given the same reference numerals as corresponding elements in FIG. 3. Camera 160 thus includes an image-capture subsection 30, comprising lens 32 and one or more image detectors 34. As with the embodiment of FIG. 3, the image capture unit 38 comprises circuitry used in conjunction with the image detector 34 to read pixel data captured by the detector 34 and the user interface unit 40 functions to determine if there is space left to record data, to capture an image and to add non-image data to the recorded data. The optional non-image data acquisition unit 42 obtains supplementary data of the types described herein for inclusion with the stored image data and presents the supplementary data to user interface unit 40. Design of actual circuitry to implement the functions of user interface unit 40 and non-image data acquisition unit is a trivial exercise for a skilled digital designer.

As in the camera 12 of FIG. 3, the input signal processing unit 44 prepares the digital data prepared by the image capture unit 38 for transfer to the holographic storage system by dividing the subject image into a stream of coded digital image pages, compressing the image, dividing the image into data pages, formatting the data pages, adding error correction coding, and applying modulation coding. The storage control unit 46 obtains the processed image and other digital data from input signal processing unit 44 and transfers that data to the holographic storage and retrieval subsystem 48.

In addition to the above-described functionality of camera 160 of FIG. 11, optional compression unit 162 obtains the image data from image capture unit 38 and compresses the data for storage in a secondary storage subsystem, which, in this embodiment, is an electronic storage subsystem 164. Persons of ordinary skill in the art will understand that this compression step is not necessary to practice of the embodiment of the camera shown in FIG. 11. Electronic storage subsystem 164 may comprise semiconductor memory such as flash or random access memory, or other types of storage known in the data processing art. Alternatively, other secondary storage subsystems, such as compact hard disk drives, can be employed.

A camera such as is shown in FIG. 11 including a parallel electronic storage subsystem, such as flash or random access memory, can employ that subsystem to review or inspect one or more images.

Figure 12:
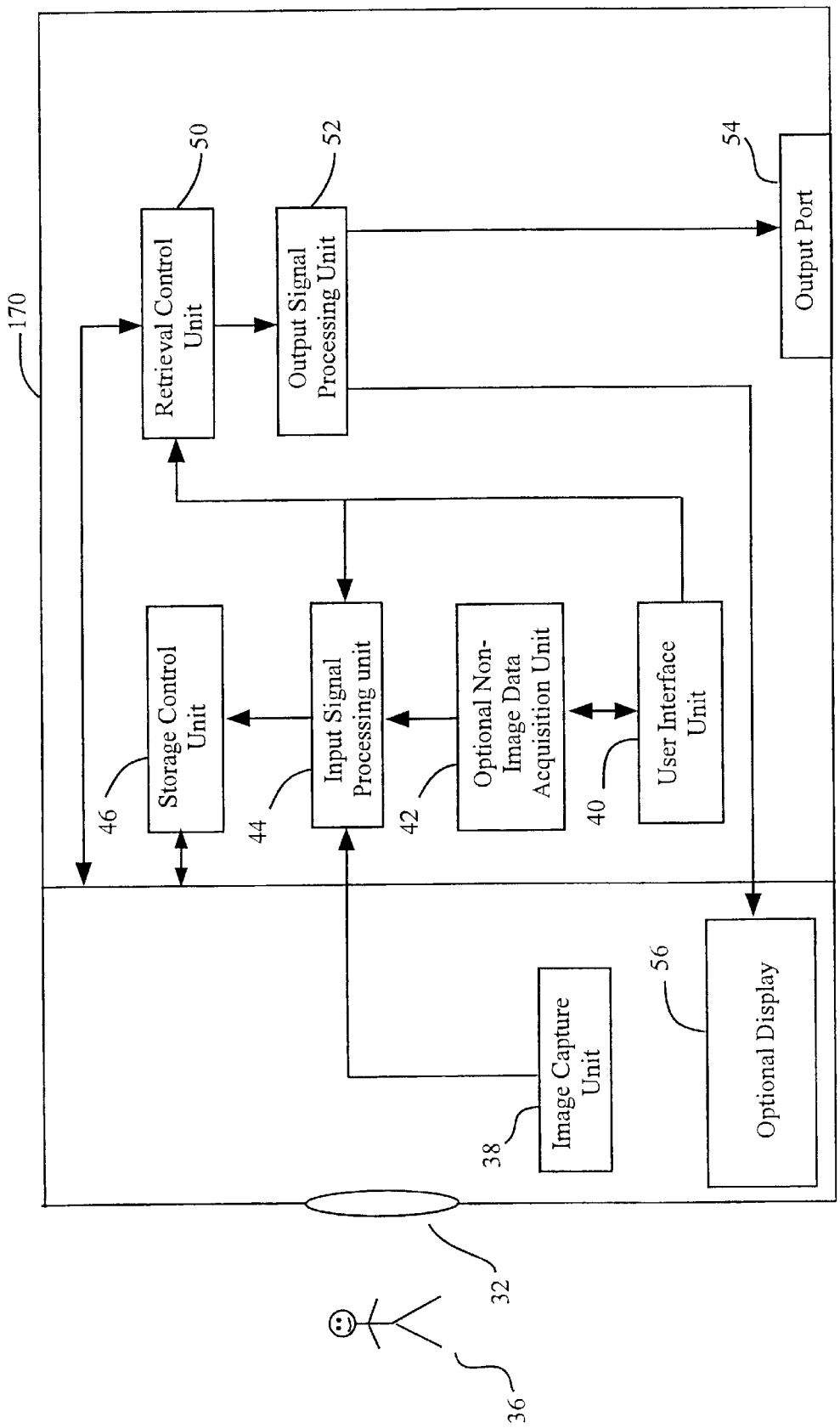
FIG. 12 is a block diagram of an alternate embodiment of a digital holographic camera according to the present invention.

Referring now to FIG. 12, a block diagram of an alternate embodiment of a digital holographic camera according to the present invention is shown. The digital holographic camera 170 of FIG. 12 may be used for both recording and readout of digital holographic data and uses some of the same components for both image capture and projection and for holographic recording and retrieval. Elements of the digital holographic camera 170 of FIG. 12 that correspond to elements of the camera of FIG. 3 are assigned the same reference numerals as their counterparts in FIG. 3.

Figure 13:
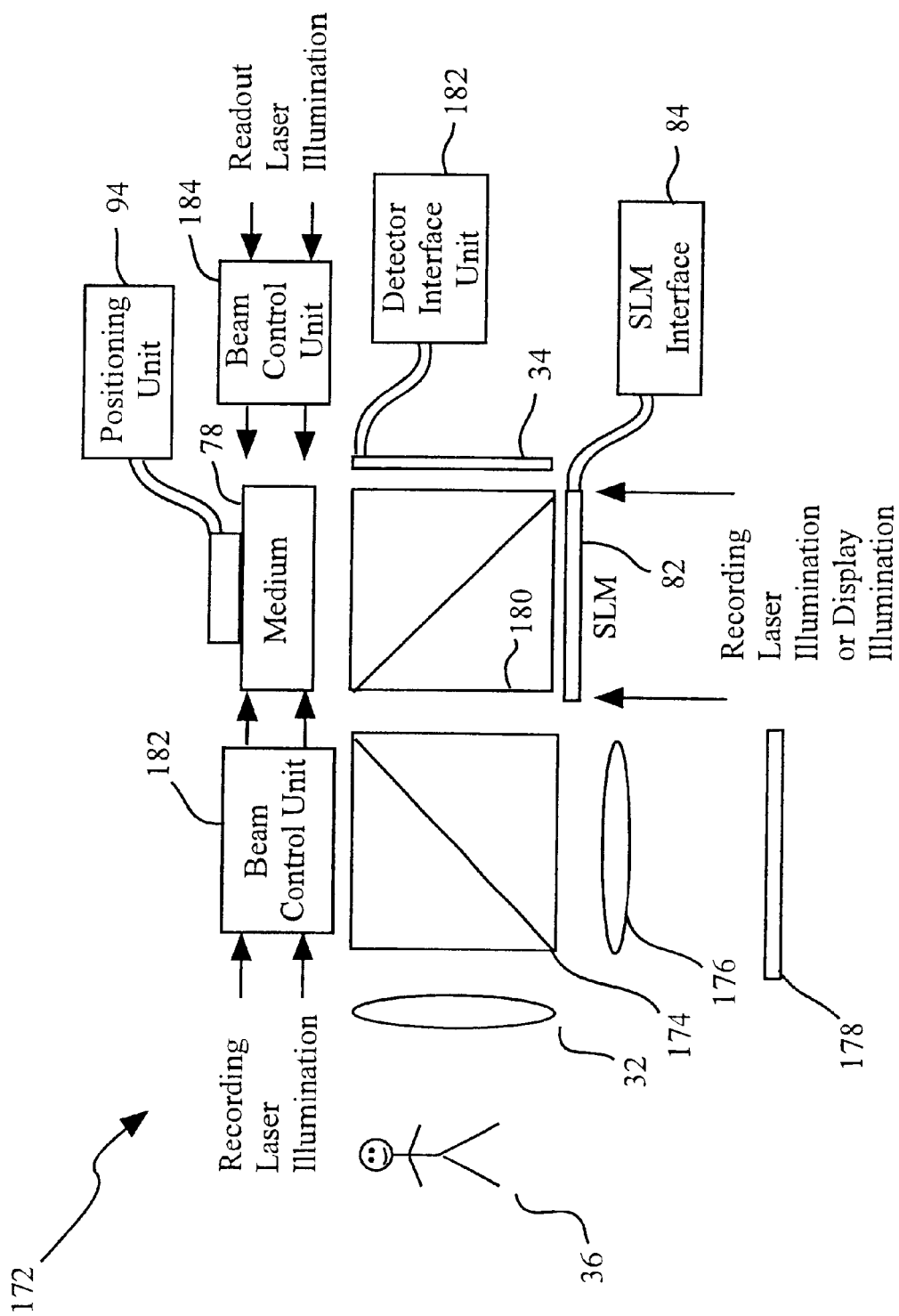
FIG. 13 is a diagram of an illustrative integrated image capture and holographic and retrieval subsystem for use in the digital holographic camera of FIG. 12.

Digital holographic camera 170 includes an integrated image capture and holographic storage and retrieval subsystem 172, an illustrative embodiment of which is shown in FIG. 13. This subsystem combines the capture, storage, retrieval and readout functions of the present invention.

Referring to both FIGS. 12 and 3, an image of subject 36 is focused by lens 32 into the integrated image capture and holographic storage and retrieval subsystem 172. Light from the subject passes through a first beam splitter 174 to allow the image to be viewed, via lens 176 and viewer/display 178. Persons of ordinary skill in the art will appreciate that first beam splitter 174, lens 176, and viewer/display 178 are optional and are not necessary for the practice of the present invention.

Light from the image of subject 36 passes through second beam splitter 180 to image detector 34. Here, detector interface unit 182 functions to control detector 90 for image capture as well as retrieval of data of holographically stored data and presents its output data to image capture unit 38. As in the embodiment of FIG. 3, image capture unit 38 provides the image data to input signal processing unit 44 and storage control unit 46. These two units perform the functions disclosed with reference to the embodiment of FIG. 3.

The output data from storage control unit 46 is used to control the recording of the image on medium 78 via beam control unit 182 (comprising deflector 70 and deflection unit 72 of FIG. 4), positioning unit 94 and SLM interface unit 84 in the same manner as in the embodiment of FIG. 3. A second beam control unit 184 is positioned on the other side of medium 78 and is used to position, for example, a phase conjugate of the reference beam for the image retrieval process in which the SLM 82 and the data detector 34 are arranged to be at the same optical distances from the medium 78. To retrieve stored digital holograms, beam control unit 184 directs readout laser illumination to the medium, whose position is selected by positioning unit 94. The output signal beam is partially deflected by beam splitter 180 to detector 34 and the data are read by detector interface unit 182. Data is received by data retrieval control unit 50 (FIG. 12) where it can be optionally transferred ultimately to the SLM 82 via the SLM interface unit 84. For the readout process, the SLM 82 is illuminated by ordinary light, and is partially deflected by the second beam splitter 180 and then optically deflected by the first beam splitter 174 from which it is projected through lens 176 onto a display for viewing.

A simple detector can be used for monochromatic imaging. Alternatively, for color imaging, detector 90 can be used with a filter to provide color filtering for pixel data as is well known in the art. During capture of the subject image, the filter is positioned in front of detector and during retrieval it is moved out of the optical path.

Light loss due to reflections by the beam splitter adjacent to the medium can be reduced by selecting an appropriate material and suitable recording geometries. In one example, using a thin medium in the transmission geometry, in which the signal and reference beams are incident on the same side of the medium, one polarization of light passes through the beam splitter during a recording step, and the orthogonal polarization is used for data retrieval, thereby reconstructing a signal beam with the appropriate polarization to be deflected to the detector.

Figure 14:
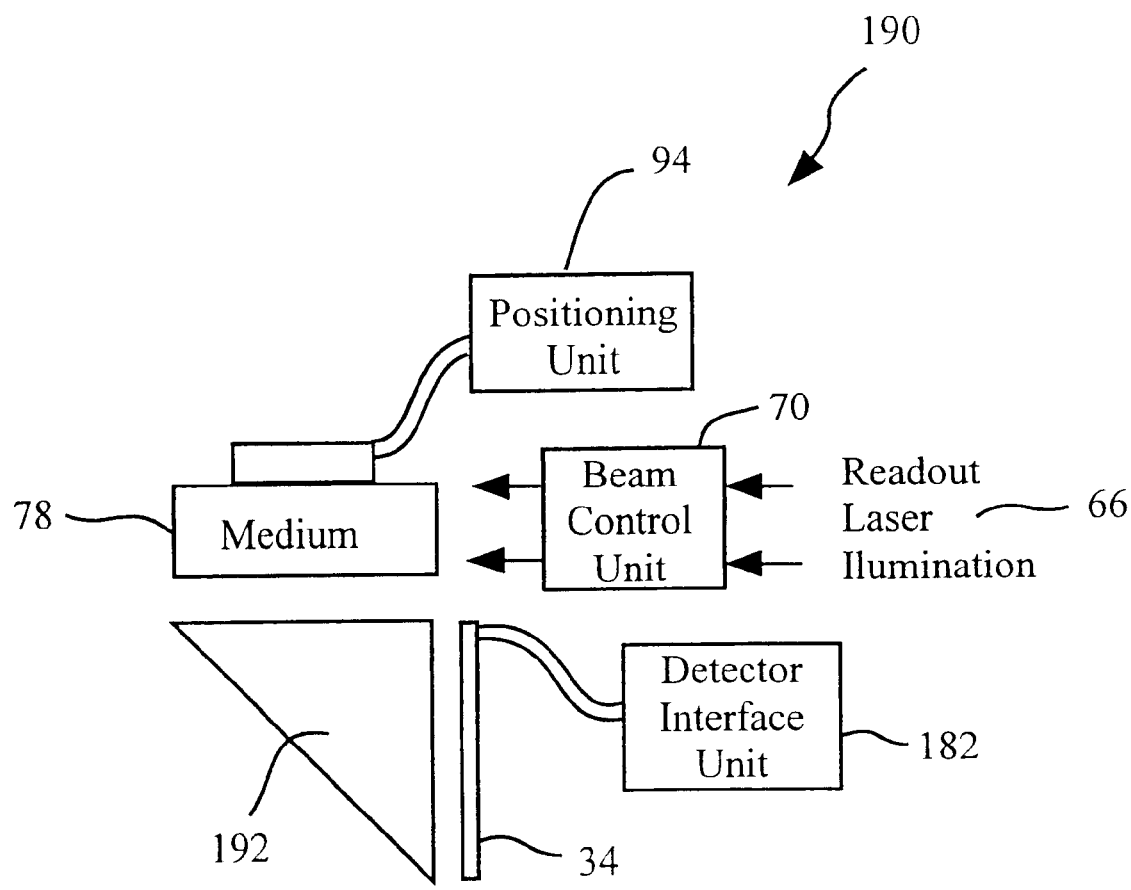
FIG. 14 is a diagram of a holographic retrieval subsystem that may be employed with a digital holographic camera according to the present invention.

Referring now to FIG. 14 a diagram of an embodiment of a holographic retrieval subsystem 190 that can be used with a digital holographic camera according to the present invention. Reader 190 is similar in geometry to the holographic retrieval subsystem of FIG. 9E and the holographic retrieval portion of FIG. 13, except that it employs a reflecting prism 192 in the place of second beam splitter 180 of FIG. 13.

The digital holographic cameras according to the present invention disclosed herein may be provided with other features that enhance their functionality. For example, a digital holographic camera according to the present invention can be equipped with SLR viewing, viewing by using a second SLM, or viewing by viewfinder. In addition, in one embodiment, the camera can be programmed for a variety of functions related to media use, such as resolution control. An example is a switch-out digital management card. In another embodiment of the present invention, the SLM used for recording data can also be reused for presenting the recorded image. In yet other embodiments, image readout can be made possible at the camera.

The camera can comprise part of an overall information manager unit. Voice annotation and other data can be stored with the photographs. A card-based medium with an additional magnetic strip could double as a credit card, phone card, or other use. Supplementary data stored with the digitized photographs could include schedules, addresses, telephone directories, notes, and other personal information. The information manager can also include a cellular telephone. The information manager may also include a global positioning system subunit.

In one embodiment, the information manager has an SLM display that can be used not only to display photographs but also to display a variety of data and information.

Additional configurations, such as a transferable subsystem that would include a medium and reader combined, or a medium and portion of the reader combined (e.g. medium and optics, medium and detector), or a medium and portion of the camera combined (e.g. mediumland optics, medium and SLM) can be employed.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A digital camera apparatus, comprising:
   (a) imaging means for converting optical information to pixel data and generating a digital image therefrom;
   (b) input signal processing means, operatively coupled to said imaging means, for compressing said digital image, dividing said digital image into a plurality of data pages, and formatting said plurality of data pages;
   (c) a holographic storage and retrieval subsystem including;
      (i) an optical storage medium;
      (ii) a signal beam directed at said optical medium;
      (iii) means for encoding said plurality of data pages into said signal beam;
      (iv) a reference beam directed at said optical medium; and
      (v) means for controlling said reference beam;
   (d) storage control means, operatively coupled to said input signal processing means and said holographic storage and retrieval subsystem, for directing operation of said means for controlling said reference beam to multiplex said plurality of data pages within said optical medium; and
   (e) user interface means, operatively coupled to said imaging means and said storage control means, for adding non-image data to said plurality of data pages.

2. The digital camera apparatus of claim 1, further comprising retrieval control means, operatively coupled to said holographic storage and retrieval subsystem, for further directing operation of said means for controlling said reference beam to recover said multiplexed data pages from said optical medium.

3. The digital camera apparatus of claim 2, further comprising output signal processing means, operatively coupled to said retrieval control means, for interpreting said formatting of said plurality of data pages, assembling said data pages into image data and decompressing said image data.

4. The digital camera apparatus of claim 3, further comprising a display operatively coupled to said output signal processing means.

5. The digital camera apparatus of claim 2, further comprising means for positioning said optical storage medium, said means for positioning said optical medium operatively coupled to said storage control means and said retrieval control means.

6. The digital camera apparatus of claim 2, further comprising a detector operatively coupled to said retrieval control means via a detector interface unit, said detector positioned to detect light of said reference beam diffracted from said optical storage medium.

7. The digital camera apparatus of claim 1, wherein said optical storage medium is removable.

8. The digital camera apparatus of claim 1, wherein said means for encoding said plurality of data pages comprises a spatial light modulator, said spatial light modulator operatively coupled to said storage control means via a spatial light modulator interface unit.

9. The digital camera apparatus of claim 1, wherein said means for controlling said reference beam comprises a movable beam deflector, said movable beam deflector operatively coupled to said storage control means via a deflection unit, said beam deflector positioned in said reference beam.

10. The digital camera apparatus of claim 1, wherein said input signal processing means further comprises:
(a) means for adding redundant data error to said plurality of data pages for error correction coding; and
(b) means for applying modulation coding to said plurality of data pages.

11. The digital camera apparatus of claim 1, wherein said signal beam and said reference beam are incident on a single side of said optical storage medium.

12. The digital camera apparatus of claim 1, wherein said signal beam and said reference beam are incident on opposite sides of said optical storage medium.

13. A method for recording digital holographic images, comprising:
(a) capturing a subject image;
(b) acquiring non-image data;
(c) coupling said subject image with said non-image data;
(d) digitizing said subject image and non-image data to form a digitized subject image;
(e) compressing said digitized subject image and said non-image data;
(f) dividing said digitized subject image and said non-image data into at least one digital image page;
(g) loading said digital image page into a spatial light modulator;
(h) encoding said digital image page into a signal beam;
(i) providing a reference beam; and
(j) storing said digital image page in an optical storage medium.

14. The method of claim 13, wherein said storing said digital image page comprises:
(a) directing said signal beam into said optical storage medium;
(b) directing a reference beam into said optical storage medium; and
(c) recording interference of said signal beam and said reference beam in said optical storage medium.

15. The method of claim 13, further comprising formatting said digital image page.

16. The method of claim 15, wherein said formatting comprises data interleaving, designation of data sections, and defining of pixel regions.

17. The method of claim 13, further comprising performing error correction coding on said digital image page.

18. The method of claim 17, further comprising performing modulation coding on said digital image page.

19. The method of claim 17, wherein said performing error correction coding comprises adding redundant bits to said digital image page, said redundant bits configured to allow correction of bit errors according to said error correction coding.

20. A digital holographic camera apparatus operable in the manner of a conventional film camera, said digital holographic camera apparatus comprising:
(a) an image capture unit configured to generate a digital image from a subject image;
(b) a non-image data acquisition unit for acquiring non-image data;
(c) an input signal processing unit, operatively coupled to said image capture unit and said non-image data acquisition unit, and configured to compress said digital image and format said digital image and non-image data into a plurality of data pages;
(d) a holographic storage and retrieval unit including;
(i) an optical medium;
(ii) a signal beam directed at said optical medium;
(iii) a spatial light modulator positioned in said signal beam and configured to encode said plurality of data pages into said signal beam;
(iv) a reference beam directed at said optical medium; and
(v) a beam deflector positioned to control incidence angle of said reference beam with respect to said optical medium; and
(e) a storage control unit, operatively coupled to said input signal processing unit and said holographic storage and retrieval unit, said storage control unit configured to control said beam deflector for multiplexing said plurality of data pages within said medium.

21. The digital camera apparatus of claim 20, further comprising a retrieval control unit, operatively coupled to said holographic storage and retrieval subsystem, and configured to further direct operation of said beam deflector to recover said multiplexed data pages from said optical medium.

22. The digital camera apparatus of claim 21, further comprising a output signal processing unit, operatively coupled to said retrieval control unit, and configured to interpret said formatting of said plurality of data pages, assemble said data pages into image data and decompress said image data.

23. The digital camera apparatus of claim 20, wherein said optical storage medium is removable.

24. A digital holographic image reader comprising:
(a) a holographic storage and retrieval subsystem including;
(i) a reference beam;
(ii) a removable optical storage medium positioned in said reference beam for capturing multiple images with variable image resolution as multiplexed data pages, at least one of said data pages having a first resolution and at least one of said data pages having a second resolution higher than said first resolution;
(iii) means for controlling said reference beam; and
(iv) a detector positioned in said reference beam after said optical storage medium;
(b) retrieval control means, operatively coupled to said holographic storage and retrieval subsystem, for directing operation of said means for controlling said reference beam to recover said multiplexed data pages from said optical medium; and
(c) output signal processing means, operatively coupled to said retrieval control means, for interpreting formatting of data pages recorded in said optical storage medium and assembling said data pages into image data and decompressing said image data.

* * * * *